(12) United States Patent
Beasom

(10) Patent No.: US 7,410,860 B2
(45) Date of Patent: Aug. 12, 2008

(54) METHOD OF MANUFACTURING LATERAL MOSFET STRUCTURE OF AN INTEGRATED CIRCUIT HAVING SEPARATED DEVICE REGIONS

(75) Inventor: James D. Beasom, Melbourne Village, FL (US)

(73) Assignee: Intersil Americas Inc., Milpitas, CA (US)

( * ) Notice: Subject to any disclaimer, the term of this patent is extended or adjusted under 35 U.S.C. 154(b) by 154 days.

(21) Appl. No.: 11/238,344

(22) Filed: Sep. 29, 2005

(65) Prior Publication Data

US 2006/0024897 A1    Feb. 2, 2006

Related U.S. Application Data

(62) Division of application No. 10/950,273, filed on Sep. 24, 2004, now Pat. No. 6,974,753, which is a division of application No. 09/990,330, filed on Nov. 21, 2001, now Pat. No. 6,822,292.

(51) Int. Cl.
 *H01L 21/8234* (2006.01)
(52) U.S. Cl. .............. 438/237; 438/328; 438/519; 438/521; 257/E27.051
(58) Field of Classification Search ............ 438/172, 438/180, 185, 188, 191, 208, 220, 230, 231, 438/237, 305, 328, 519, 521; 257/E27.016, 257/E27.017, E27.022, E27.039, E27.051
See application file for complete search history.

(56) References Cited

U.S. PATENT DOCUMENTS

| 5,264,719 | A | 11/1993 | Beasom |
| 5,306,652 | A | 4/1994 | Kwon et al. |
| 5,482,888 | A | 1/1996 | Hsu et al. |
| 5,918,137 | A | 6/1999 | Ng et al. |
| 6,242,787 | B1 | 6/2001 | Nakayama et al. |

(Continued)

FOREIGN PATENT DOCUMENTS

EP    0309828    4/1989

(Continued)

OTHER PUBLICATIONS

Disney, D.R. et al., "A new 800V lateral MOSFET with dual conduction paths", Jun. 2001, ISPS '01, Proc. 13th Sym., pp. 399-402.

*Primary Examiner*—George Fourson
*Assistant Examiner*—Julio J Maldonado
(74) *Attorney, Agent, or Firm*—Fogg & Powers LLC

(57) ABSTRACT

Apparatus and Methods for the self-alignment of separated regions in a lateral MOSFET of an integrate circuit. In one embodiment, a method comprising, forming a relatively thin dielectric layer on a surface of a substrate. Forming a first region of relatively thick material having a predetermined lateral length on the surface of the substrate adjacent the relatively thin dielectric layer. Implanting dopants to form a top gate using a first edge of the first region as a mask to define a first edge of the top gate. Implanting dopants to form a drain contact using a second edge of the first region as a mask to define a first edge of the drain contact, wherein the distance between the top gate and drain contact is defined by the lateral length of the first region.

8 Claims, 27 Drawing Sheets

U.S. PATENT DOCUMENTS

| | | |
|---|---|---|
| 6,469,346 B1 | 10/2002 | Kawaguchi et al. |
| 6,642,599 B1 | 11/2003 | Watabe et al. |
| 6,773,997 B2 * | 8/2004 | Imam et al. .................. 438/286 |
| 6,974,753 B2 * | 12/2005 | Beasom ...................... 438/306 |
| 2002/0185696 A1 | 12/2002 | Beasom |

FOREIGN PATENT DOCUMENTS

| | | |
|---|---|---|
| GB | 2215515 | 9/1989 |

* cited by examiner

US 7,410,860 B2

METHOD OF MANUFACTURING LATERAL MOSFET STRUCTURE OF AN INTEGRATED CIRCUIT HAVING SEPARATED DEVICE REGIONS

CROSS REFERENCE TO RELATED APPLICATION

This application is a divisional application of U.S. patent application Ser. No. 10/950,273, filed Sep. 24, 2005 now U.S. Pat. No. 6,974,753, which is a divisional application of U.S. patent application Ser. No. 09/990,330, filed Nov. 21, 2001, now U.S. Pat. No. 6,822,292.

TECHNICAL FIELD

The present invention relates generally to integrated circuits and in particular the present invention relates to the self-alignment of separated regions in a lateral MOSFET structure of an integrated circuit.

BACKGROUND

Integrated circuits incorporating high voltage lateral elements include both metal-oxide-semiconductor field-effect transistors (MOSFETs) devices and bipolar junction transistors. A common use of a power MOSFET in an integrated circuit is as an electronic switch. One known high-voltage MOSFET structure for an integrated circuit includes a drain contact connected to the drain end of a channel by a lateral drain extension, which has the same conductively type as the drain contact. High voltage breakdown is achieved by designing the drain extension with an integrated doping (dopant ions per $cm^2$) such that the drain extension totally depletes at high drain voltages, before the point where avalanche breakdown occurs at a pn junction between the drain extension and the MOSFET body.

Along with size of the structure, there are two other key characteristics of a MOSFET when used in an integrated circuit as an electronic switch. The first is its breakdown voltage and the second is its ON resistance. The breakdown voltage is a measure of the MOSFET's ability to withstand a reversed bias voltage when it is in an OFF or open condition. The ON resistance is a measure of the resistance when the MOSFET is in an ON or closed condition. Improving the operation of the MOSFET switch in an integrated circuit suggests a breakdown voltage as high as possible and an ON resistance as low as possible. A perfect switching device has an infinite breakdown voltage and zero ON resistance. Accordingly, it is desired in the art to reduced the ON resistance. One way of reducing the ON resistance of a lateral MOSFET device is to accurately align various regions of the MOSFET to achieve predefined space between the regions. Unfortunately this is difficult to do with existing techniques because mask edges used to form the various regions introduce an uncertainty factor called an alignment tolerance that contributes to the space between the regions.

For the reasons stated above and for other reasons stated below which will become apparent to those skilled in the art there is a need for a method of accurately controlling the distance between various regions in integrated circuits.

SUMMARY

The above mentioned problems with integrated circuits with high voltage MOSFETs and other problems are addressed by the present invention and will be understood by reading and studying the following specification.

In one embodiment, a method of forming a MOSFET device in an integrated circuit is disclosed. The method comprising, forming a relatively thin dielectric layer on a surface of a substrate. Forming a first region of relatively thick material having a predetermined lateral length on the surface of the substrate adjacent the relatively thin dielectric layer. Implanting dopants of the first conductivity type in the substrate to form a top gate using a first edge of the first region as a mask to define a first edge of the top gate. Implanting dopants of a second conductivity type with high dopant density to form a drain contact using a second edge of the first region as a mask to define a first edge of the drain contact, wherein the distance between the top gate and drain contact is defined by the lateral length of the first region.

In another embodiment, a method of forming a lateral MOSFET device in an integrated circuit. The method comprising, forming a dielectric layer on a surface of a substrate, wherein the dielectric layer has a relatively thick dielectric region and a relatively thin dielectric region. Forming a gate electrode overlaying a portion of the relatively thin dielectric region. Introducing a first conductivity type dopant to form a top gate region along the surface of the substrate, wherein a first edge of the top gate region is defined by a second edge of the gate electrode and a second edge of the top gate region is defined by a first edge of the relatively thick dielectric region. Introducing a second conductivity type dopant with a high dopant density to form a first region of the second conductivity type along the surface of the substrate, wherein a first edge of the first region is defined by a second edge of the relatively thick dielectric region. Moreover, the first edge of the first region is separated from the second edge of the top gate region by a lateral length of the relatively thick dielectric region.

In another embodiment, a method of forming a lateral MOSFET device in an integrated circuit. The method comprising, forming a dielectric layer on a surface of a substrate. The dielectric layer has a relatively thick dielectric region and a relatively thin dielectric region. Forming a gate electrode overlaying a portion of the relatively thin dielectric region. Introducing a first conductivity type dopant to form a top gate region along the surface of the substrate, wherein a first edge of the top gate region is defined by a second edge of the gate electrode and a second edge of the top gate region is defined by a first edge of the relatively thick dielectric region. Introducing a second conductivity type dopant with a high dopant density to form a first region of the second conductivity type along the surface of the substrate, wherein a first edge of the first region is defined by a second edge of the relatively thick dielectric region. Moreover, the first edge of the first region is separated from the second edge of the top gate region by a lateral length of the relatively thick dielectric region.

In another embodiment, a method of forming a high voltage MOSFET for an integrated circuit. The method comprising, forming a relatively thin layer of dielectric on a surface of a substrate. Depositing a gate material layer on the relatively thin layer of dielectric, removing portions of the gate material layer to form a first and second gate material regions of predetermined lateral lengths. Introducing a first conductivity type dopant in the substrate to form a top gate using first edges of the first and second gate material regions as masks, wherein the top gate is formed adjacent the surface of the substrate and laterally between the first and second gate material regions. Introducing a second conductivity dopant of high dopant density in the substrate to form a drain region adjacent the surface of the substrate using a second edge of the second gate material region as a mask to form a first edge of the drain region, wherein the second gate material region is positioned laterally between the drain region and the top gate. In addition, the spaced distance between the top gate and the drain region is determined by the lateral length of the second gate material region.

In another embodiment, a method of forming a lateral MOSFET in an integrated circuit. The method comprising, forming a drain contact of a second conductivity type with a high density dopant in a substrate adjacent a surface of the substrate. Forming a top gate of the first conductivity type in the substrate adjacent the surface of the substrate and a predetermined distance from the drain contact after the drain contact is formed. In addition, the drain contact is formed to extend deeper from the surface of the substrate than the top gate and is formed to have a higher dopant density at every depth than the top gate so a mask is not needed to shield the drain contact from the first conductivity dopants during formation of the top gate.

In another embodiment, a method of forming a pn junction diode in an integrated circuit is disclosed. The method comprising, forming a first region of relatively thick material on the surface of a substrate. Forming a second region of relatively thick material on the surface of a substrate a predetermined distance from the first region. Implanting high density of dopants of the second conductivity type in the substrate to form a cathode contact using first edges of the first and second regions as masks to define edges of the cathode contact, wherein the cathode contact is positioned between the first and second regions. Implanting dopants of the first conductivity type in the substrate to form first and second top gate regions using second edges of the first and second regions as masks to define first edges of the first and second top gate regions, wherein the distance between the cathode contact and the first top gate region is defined by the lateral length of the first region and the distance between the cathode contact and the second top gate region is defined by the lateral length of the second region. Implanting high density dopants of the first conductivity type in the substrate to form first and second anode contact regions.

In another embodiment, a method of forming a high voltage bipolar transistor in an integrated circuit is disclosed. The method comprising, forming a first region of relatively thick material on a surface of a substrate. Forming a second region of relatively thick material on the surface of the substrate a predefined distance from the first region. Introducing dopant of a second conductivity type to form a base region in the substrate using first edges of the first and second regions to form edges of the base region, wherein the base region is positioned between the first and second regions. Introducing dopants of the first conductivity type to form a first top gate using a second edge of the first region as a mask to form an edge of the first top gate, wherein the distance between the first top gate and the base region is defined by the lateral length of the first region. Introducing dopants of the first conductivity type to form a second top gate using a second edge of the second region as a mask to form an edge of the first top gate, wherein the distance between the second top gate and the base region is defined by the lateral length of the second region.

In another embodiment, a lateral MOSFET for an integrated circuit is disclosed. The lateral MOSFET comprising a substrate, a relatively thin layer of dielectric, a first region of relatively thick material, a drain contact and a first top gate. The relatively thin layer of dielectric is formed on a surface of the substrate. The first region of relatively thick material is formed on the surface of the substrate adjacent the relatively thin dielectric material. The first region has a predefined lateral length. Moreover, the first region can mask dopants from penetrating the surface of the substrate. The drain contact region is of a second conductivity type with high dopant density. It is formed in the substrate adjacent the surface of the substrate. The first region is used as a mask to form a first edge of the drain contact. The first top gate is of the first conductivity typed and is formed in the substrate adjacent the surface of the substrate. The first region is used as a mask to form a first edge of the first top gate. The distance between the drain contact region and the first top gate is defined by the lateral length of the first region.

In another embodiment, a lateral MOSFET for an integrated circuit is disclosed. The lateral MOSFET of this embodiment comprises a substrate, a relatively thick dielectric region, a relatively thin dielectric region, a gate electrode, a first top gate region, a drain region and a source. The relatively thick dielectric region is formed on a surface of the substrate. The relatively thick dielectric region has a predetermined lateral length. The relatively thin dielectric region is formed on the surface of the substrate. The gate electrode is deposited on the relatively thin dielectric region. The first top gate region of the first conductivity type is formed in the substrate adjacent the surface of the substrate and between the gate electrode and the relatively thick dielectric region. The drain region of a second conductivity type has a high donor density formed in the substrate adjacent the surface of the substrate and adjacent the relatively thick dielectric region. The relatively thick dielectric region is used as a mask to define a lateral distance between the first top gate region and the drain region. The source region of the second conductivity type having a high donor density formed in the substrate adjacent the surface of the substrate. The gate electrode is laterally positioned between the source region and the first top gate.

In another embodiment, a solid state relay integrated circuit is disclosed. The solid state relay comprises a photo diode stack, a first high voltage MOSFET and a second high voltage MOSFET. The photo diode stack is used to drive a voltage and has a first output and a second output. The first high voltage MOSFET has a gate, source and drain. The gate of the first high voltage MOSFET is coupled to the first output of the photo diode stack. The source of the first high voltage MOSFET is coupled to the second output. The second high voltage MOSFET has a gate, source and drain. The gate of the second high voltage MOSFET is coupled to the first output of the photo diode stack. The source of the second high voltage MOSFET is coupled to the second output of the photo diode stack. The first and second high voltage MOSFETs each comprise a substrate, a relatively thin layer of dielectric, a first region of relatively thick material, a drain contact region and a top gate. The relatively thin layer of dielectric is formed on a surface of the substrate. The first region of relatively thick material is formed on the surface of the substrate adjacent the relatively thin dielectric material and has a predefined lateral length. The first region can mask dopants from penetrating the surface of the substrate. The drain contact region is of a second conductivity type with high dopant density and is formed in the substrate adjacent the surface of the substrate. The first region is used as a mask to form a first edge of the drain contact. The first top gate of the first conductivity typed is formed in the substrate adjacent the surface of the substrate. The first region is used as a mask to form a first edge of the first top gate. Moreover, the distance between the drain contact region and the first top gate is defined by the lateral length of the first region.

In another embodiment, a pn junction for an integrated circuit is disclosed. The pn junction for an integrated circuit comprises a substrate, a first and second region of relatively thick material, a cathode contact, a first and second top gate and a first and second anode contact. The first region of relatively thick material is formed on a surface of the substrate. The second region of relatively thick material is formed on the surface of the substrate a predetermined lateral distance from the first region. The cathode contact is of a second conductivity type with high dopant density and is formed in the substrate adjacent the surface of the substrate. The cathode contact is positioned between the first and second regions, wherein first edges of the first and second regions are used as a mask to define the edges of the cathode contacts. The first top gate of the first conductivity type formed in the substrate adjacent the surface of the substrate. A first edge first top gate is positioned adjacent a second edge of the first region. Moreover, the second edge of the first region is used as a mask to form the first edge of the first top gate. The lateral length of the first region defines the lateral distance between the first top gate and the cathode contact. The second top gate of the first conductivity type is formed in the substrate adjacent the surface of the substrate. A first edge of the second top gate is positioned adjacent a second edge of the second region. Moreover, the second edge of the second region is used as a mask to form the first edge of the second top gate. The lateral length of the second region defines the lateral distance between the second top gate and the cathode contact. The first anode contact is of the first conductivity type with high dopant density and is formed in the substrate adjacent the surface of the substrate and a predetermined distance from the first top gate. The second anode contact is of the first conductivity type with high dopant density and is formed in the substrate adjacent the surface of the substrate and a predetermined distance from the second top gate.

In another embodiment, a high voltage bipolar transistor for an integrated circuit is disclosed. The high voltage bipolar transistor for an integrated circuit comprises a substrate, a first and second region of relatively thick material, a base region and a first and second top gate. The first region is of a relatively thick material formed on a surface of a substrate. The second region also of a relatively thick material formed on the surface of the substrate a predefined distance from the first region. The base region is of a second conductivity type formed in the substrate using first edges of the first and second regions to form edges of the base region. The base region is positioned between the first and second regions. The first top gate of the first conductivity type is formed in the substrate using a second edge of the first region as a mask to form an edge of the first top gate. The distance between the first top gate and the base region is defined by the lateral length of the first region. The second top gate of the first conductivity type is formed in the substrate using a second edge of the second region as a mask to form an edge of the first top gate. The distance between the second top gate and the base region is defined by the lateral length of the second region.

BRIEF DESCRIPTION OF THE DRAWINGS

The present invention can be more easily understood and the further advantages and uses thereof more readily apparent, when considered in view of the description of the preferred embodiments and the following figures in which.

In accordance with common practice, the various described features are not drawn to scale but are drawn to emphasize specific features relevant to the present invention. Reference characters denote like elements throughout the Figures and text.

DETAILED DESCRIPTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is therefore, not to be taken in a limiting sense, and the scope of the present invention is defined only by the claims and equivalents thereof.

Embodiments of the present invention relate to integrated circuits having relatively accurate aligned regions that are spaced a predetermined distance apart from each other. Moreover, some embodiments of the present invention relate to integrated circuits having a MOSFET structure with a drain region spaced apart from a top gate a predetermined distance. In the following description, the term substrate is used to refer generally to any structure on which integrated circuits are formed, and also to such structures during various stages of integrated circuit fabrication. This term includes doped and undoped semiconductors, epitaxial layers of a semiconductor on a supporting semiconductor or insulating material, combinations of such layers, as well as other such structures that are known in the art. Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms, such as "on", "side" (as in "sidewall"), "right", "left", "higher", "lower", "over," "top" and "under" are defined with respect to the conventional plane or working surface being on the top surface of the wafer or substrate, regardless of the orientation of the wafer or substrate. Before a detailed discussion of the embodiments of the present invention are described, further background is first provided to aid in the understanding of the embodiments of the present invention.

Figure 1:
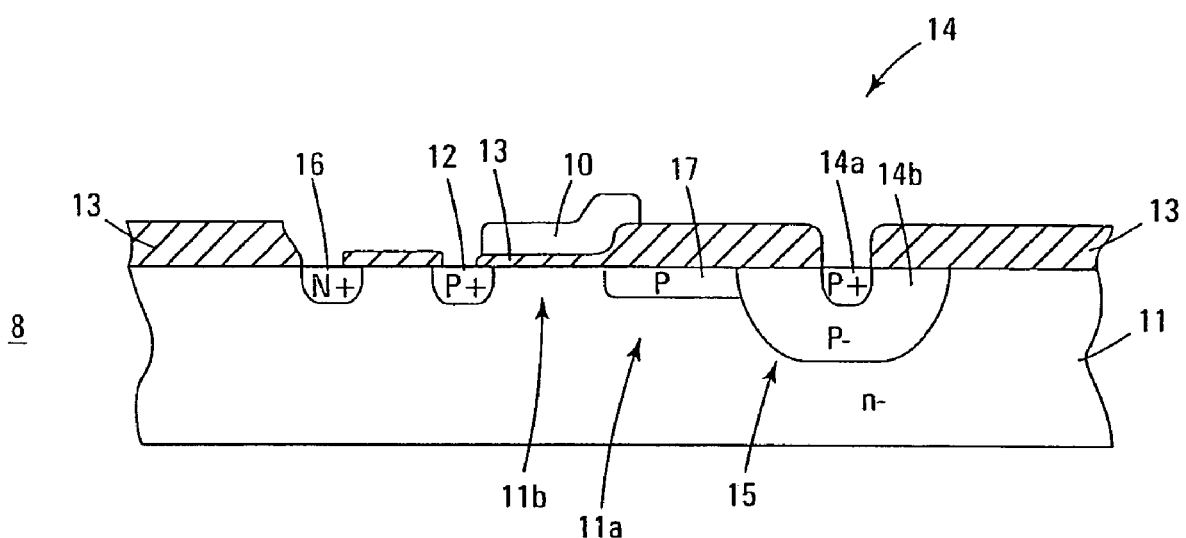
FIGS. 1 and 2 are cross-sectional views of prior art MOSFET devices.

Referring to FIG. 1, a cross-sectional view of a known high voltage lateral MOSFET device 8 is illustrated. As illustrated, the MOSFET device 8 includes a gate 10, a source 12 with P+ doping concentration and a drain 14. The drain 14 includes a P+ region 14a formed in a P− shield region 14b. The "+" indicates a high dopant density and the "−" indicates a low dopant density. The MOSFET device 8 further includes a silicon dioxide ($SiO_2$) layer 13 overlying the various active regions as shown. A body 11 of the device 8 is doped with a N-type dopant. A drift region 17 or drain extension 17 is doped with a P type dopant and extends along the top surface of the body 11. The drain extension 17 further has one edge adjacent to the P− shield region 14b. The drift region 17 forms a portion of the conducting path between the source 12 and the drain 14. A body contact 16 is also illustrated. In operation, the drain 14 is connected to a negative supply voltage, and the source 12 and body 11 are connected together and further connected to a positive supply voltage. Typically, the drain 14 is connected to ground and a positive supply voltage is supplied to the shorted source 12/body 11. More generally, the drain 14 is at a lower potential than the shorted source 12/body 11.

The drift region 17 serves as a JFET (junction field-effect transistor) channel. A region 11a of the body 11, underlying the drift region 17 provides a JFET gate function with respect to the channel of the drift region 17. The drift region 17 is designed to totally deplete (i.e., a pinch-off condition is created) at a voltage lower than the reverse bias voltage at which avalanche breakdown occurs in the pn junction between the drift region 17 and the body 11. The electric field of the fully depleted drift region 17 is determined by the applied drain voltage. The electric field across the pn junction depends on the relative concentrations of the two doped regions and is maximum at the metallurgical junction between the regions. Thus most of the reverse bias voltage is dropped across the depleted region. The length and doping concentration of the drift region 17 determine the maximum electric field that the drift region 17 can support. The source 12 and the gate 10 are safely shielded from the high drain voltage by the pinched off depleted drift region 17.

The resistance of the drift region 17 is in series with the resistance of the channel 11b, consequently, the total ON resistance of the device 8 is simply the sum of these two individual resistances. The drift region 17, which must be quite long to sustain the high reverse bias drain-source voltage, often contributes the larger of the two resistance terms, especially in high-voltage devices (for example, a drain-source voltage greater than 100 V). Thus, it is desirable to reduce the resistance of the drift region 17 so that MOSFET devices can be fabricated with lower channel ON resistance.

It is known that the drain extension resistance is inversely proportional to the drain extension integrated doping. Thus, the ON resistance can be reduced by increasing the integrated doping level. A structure and method that allows the extension integrated doping to be approximately doubled without degrading the voltage characteristics, comprises the addition of a top gate and second extension of opposite conductivity type to the first extension. The second extension is formed within the first extension. Such a dual lateral drain extension device is illustrated in commonly owned U.S. Pat. Nos. 4,823,173 and 5,264,719, which are both hereby incorporated by reference.

Figure 2:
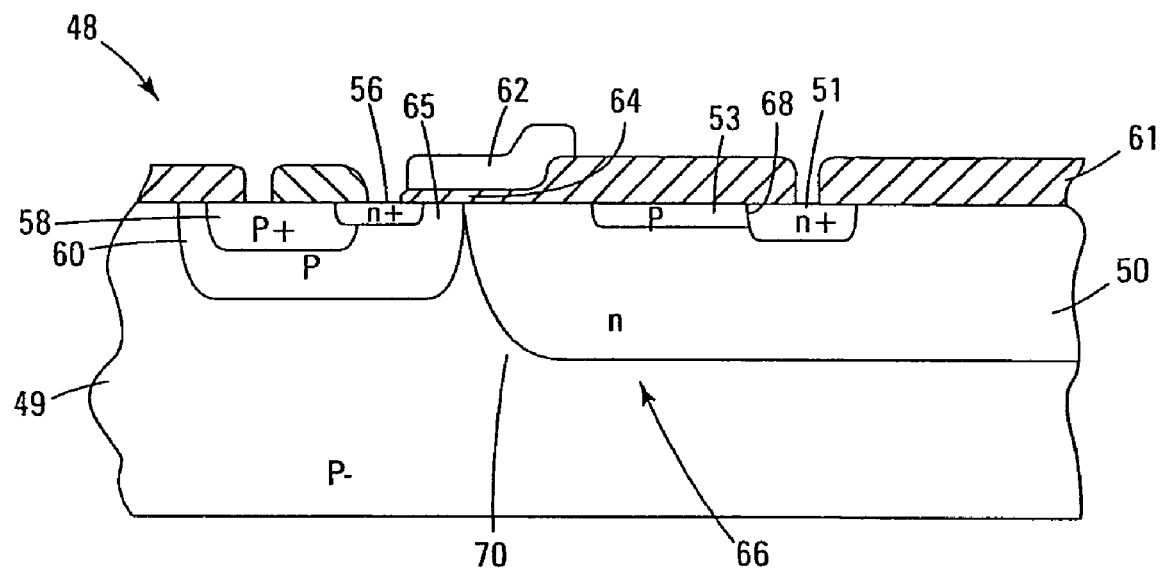

FIG. 2 illustrates such a prior art dual lateral drain extension DMOSFET device 48. The DMOSFET 48 includes a substrate 49 and an N type drift region 50 disposed therein. The DMOSFET 48 further comprises an N+ drain region 51 and a lateral P type top gate 53, both formed in the drift region 50. An N+ source region 56 and a P+ substrate contact 58 are both disposed within a P type body 60. The DMOSFET device 48 further comprises a field oxide layer 61 and a gate 62 overlying a gate oxide layer 64. The device channel is identified by a reference character 65 and can be referred to as the MOS channel 65. The top gate 53 is electrically connected to the substrate 49 in the third dimension outside the plane of FIG. 2.

The structure of FIG. 2 provides reduced ON resistance relative to the MOSFET device shown in FIG. 1 above. The reduction in ON resistance is accomplished by providing a structure with increased drift region doping (the drift region 50) without reducing the body-to-drain reverse bias breakdown voltage. This is made possible by inclusion of the top gate 53, which serves as a JFET top gate. The depletion layer at the boundary between the top gate 53 and the drift region 50 holds some drift region charge when reverse biased, which is in addition to the charge held by the depletion layer between a region 66 of the substrate 49, and the drift region 50. Note that the region 66 serves as a JFET bottom gate and is electrically connected to the top gate 53 via the substrate 49. This additional charge, in the form of fixed ionized impurity atoms, causes the channel resistance reduction. It is possible to provide approximately twice the integrated doping level in the drift region 50 than previously acceptable due to this ability to hold drift region charge. The drift region 50 of the prior art has an exemplary integrated doping of $1\times10^{12}$ phosphorous (or more generally n-type) atoms per square centimeter. Including the top gate 53 with an integrated doping of about $1\times10^{12}$ ions per square centimeter, a doping level of $2\times10^{12}$ n-type atoms per square centimeter is possible in the drift region 50. Thus, the ON resistance in the FIG. 2 device is half the ON resistance of the prior structures.

To optimize performance of the FIG. 2 structure, the top gate 53 should preferably be designed differently than a conventional JFET gate. That is, the top gate 53 should totally deplete at a body-to-drain voltage less than the reverse bias breakdown voltage of the pn junction 68 formed between the top gate 53 and drain region 51. The body-to-drain voltage is used as a reference because the top gate 53 is in contact with the body 49 in the third dimension outside the plane of FIG. 2. Therefore, the voltage at pn junction 68 equals the voltage at a pn junction 70 formed between the drift region 50 and the body 49. The voltage at which pn junction 68 is designed to breakdown should be greater than the voltage at which the top gate 53 totally depletes. Further, the top gate 53 should totally deplete before the depletion layer between the body 49 and the drift region 50 reaches the depletion layer between the top gate 53 and the drift region 50. This condition assures that a large voltage differential between the top gate 53 and the drain region 51 is not developed by punch-through action from the body 49. As is known by those skilled in the art, a conventional JFET gate (compared to the JFET action of the top gate 53) never totally depletes regardless of operating conditions.

One method of fabricating the MOSFET 48 of FIG. 2 is to form the top gate 53 or both the drain drift region 50 and the top gate 53, after the MOSFET gate 62 has been formed. Using this technique, the JFET top gate 53 can be self-aligned to the MOSFET gate 62 by using the latter as a mask when the JFET top gate 53 is formed, preferably by ion implantation. Process simulations of the MOSFET 48 of FIG. 2 indicate a high electric field at the junction between the drain contact 51 and the top gate 53. Thus the reverse bias breakdown is more likely to occur at the junction 68 than at other regions of the drain/body pn junction. The high breakdown voltage characteristic may be recovered by spacing the top gate 53 apart from the drain region 51 as illustrated by a MOSFET 90 in FIG. 3. Simulations of the embodiment illustrated in FIG. 3, achieve the desired reverse bias breakdown voltage for MOSFET 90. Current processes used to form the structure illustrated in FIG. 3 implement separate mask steps that require alignment to define the distance between the top gate 53 and the drain region 51. However, extra mask steps, especially those requiring an alignment tolerance, are undesirable in the fabrication process as they increase the fabrication cost and protract fabrication time.

In particular, with current production processes, the edge of the drain region 51 is defined by the location of an edge of an opening in a photo resist mask that serves to define where the drain region 51 is formed in the substrate 49. Similarly, the edge of the top gate 53 is also defined by the location of an opening in another photo resist mask that defines the location of the formation of the top gate 53. These two masks are aligned to a previous formed reference pattern. Thus there are two alignment uncertainties between the edges of the photo resist masks that define the edge of the drain region 51 and the edge of the top gate region 53. Using projection aligners to perform the alignment of each of the photo resist masks to the previously formed reference pattern, a sigma deviation from design location of the mask edge might be as high as $0.75 \times 10^{-6}$. Since, the alignments of the drain region 51 and the top gate 53 are independent, the 1 sigma deviation from the nominal space between their edges in this example would be: $[(0.75)^2+(0.75)^2]^{0.5}=1.06\times10^{-6}$.

Figure 3:
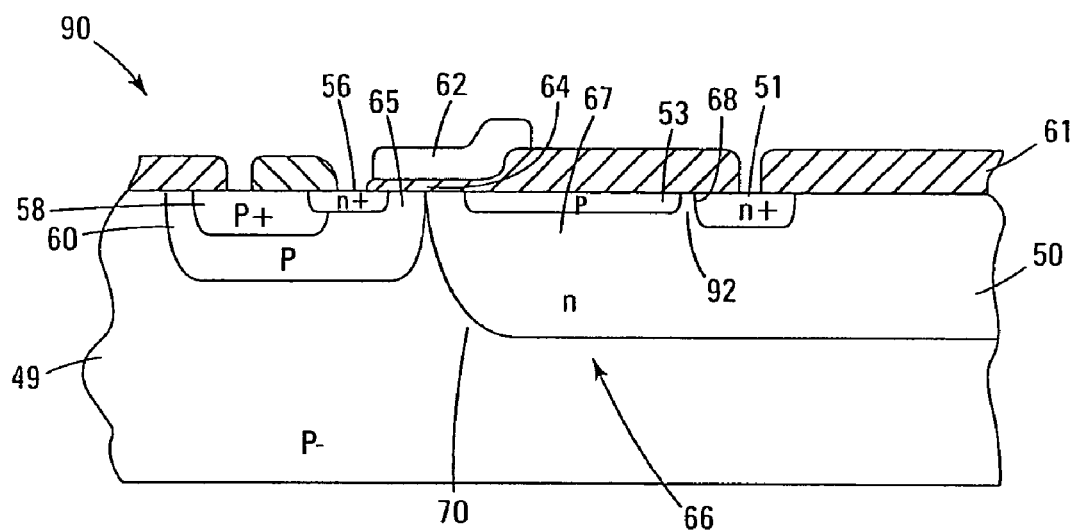
FIG. 3 is a cross-sectional view of a MOSFET device of the prior art to which the teachings of the present application can be applied.

The ON resistance of the MOSFET 90 of FIG. 3, is the sum of the various series resistances between the drain region 51 and the source region 56. This series resistance includes the drain region 51 and the source region 56, plus the resistance of MOS channel 65, the resistance of the drift region 50 (in particular the resistance of a JFET channel 67 in the drift region 50 positioned beneath the JFET channel top gate 53) and the link resistances between the JFET channel 67 under the top gate 53 and the drain region 51 and between the JFET channel 50 under the top gate 53 and the MOS channel 65. Thus, one term in the ON resistance, the link resistance from the JFET channel 67 to the drain region 51, is proportional to the length of the region 92 from an edge of the top gate 53 to an adjacent edge of the drain contact 51. This distance also increases the total device area. It is important to accurately control this length to minimize deviations in device area and ON resistance for MOSFETs constructed as illustrated in FIG. 3.

The above-mentioned undesirable variations associated with the spacing between the drain region and the JFET top gate can be reduced in accordance with the teachings of the present invention. According to the teachings of the present invention, the distance between the drain region and the top JFET gate is set without an alignment tolerance. In addition, the present invention reduces variations in the length of region 92 without the requirement of additional mask steps, thereby minimizing fabrication costs. Moreover, the present invention provides other novel teachings as disclosed and claimed below. The elements and method steps of the present invention are represented by conventional elements in the drawings, showing only those specific details that are pertinent to the present invention, so as not to obscure the disclosure with structural details that will be readily apparent to those skilled in the art having the benefit of the description herein.

Figure 4:
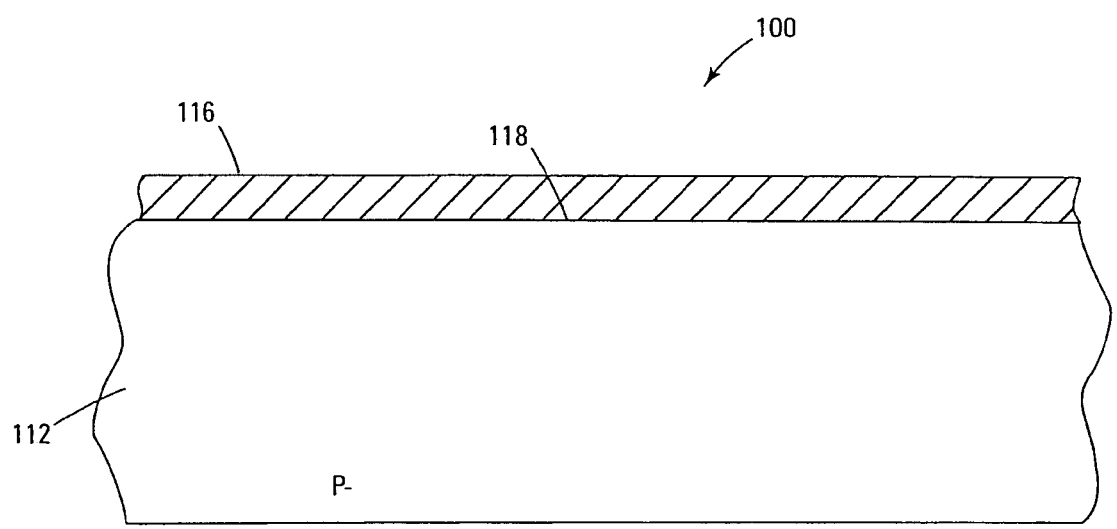
FIGS. 4 through 10A illustrate, in a cross-section view, one embodiment of the present invention during sequential fabrication steps.
Figure 5:
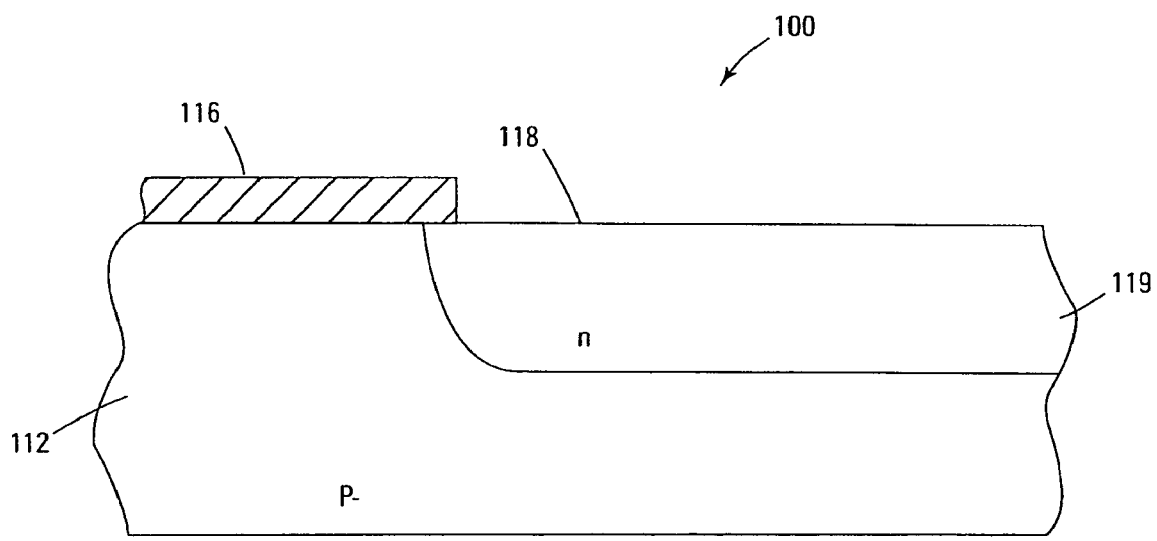
Figure 6:
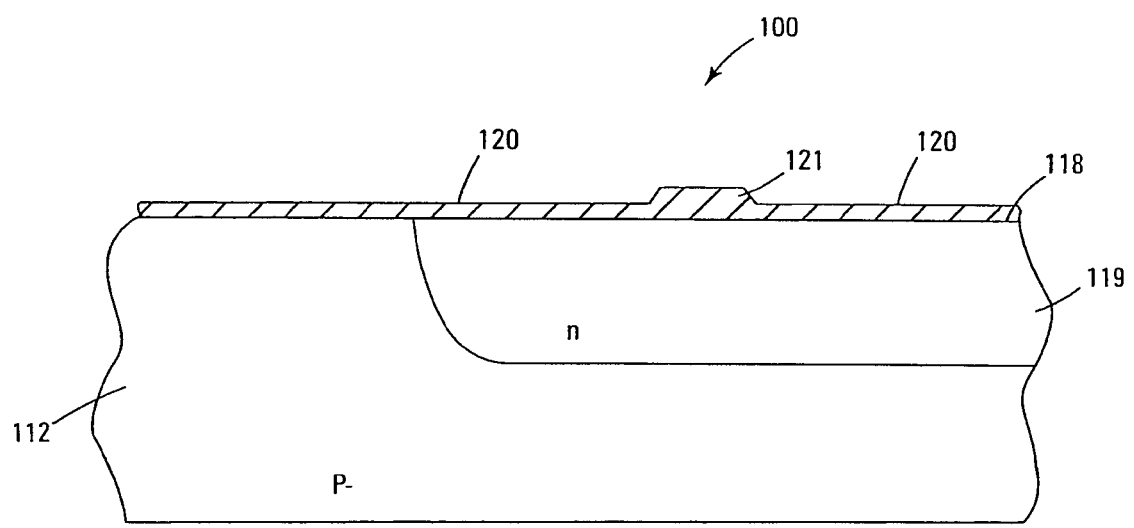

The fabrication process for a MOSFET 100 of one embodiment the present invention begins with FIG. 4, wherein a relatively thick field dielectric or oxide layer 116 is deposited, by chemical vapor deposition or thermally grown, on the upper surface 118 of the substrate 112. As shown in FIG. 5, a portion of the relatively thick field oxide layer 116 is removed by etching and a drift region 119 is formed by implanting dopants into the substrate 112 using the relatively thick oxide layer 116 as a mask. Referring to FIG. 6, the remaining portion of the thick field oxide layer 116 is removed and a dielectric layer is formed over the substrate 112. In one embodiment, the dielectric is an oxide and the dielectric layer is referred to as an oxide layer. The oxide layer comprises a relatively thin oxide layer 120 and a thick oxide region 121.

In one embodiment, the thin oxide layer 120 and thick oxide layer 121 are formed by a local oxidation of silicon process (LOCOS) above the drift region 110. In particular, the LOCOS process involves depositing silicon nitrate (nitride) over a thin oxide layer that can be referred to as the pad oxide. The nitride is then patterned and removed from areas where thick regions of oxide are to be grown. Although, not shown in the Figures, other devices formed in the integrated circuit besides the MOSFET 100 that require the formation of device regions use relatively thick regions of oxide as masks. These relatively thick regions are also formed at the same time by patterning the nitride layer in select locations. The substrate 112 is then subject to a thermal oxidation cycle which causes thick region 121 to be grown over the pad oxide as well as other thick regions beyond the MOSFET 100 device not covered by the nitride. Hence, the nitride acts as a mask in growing the thick regions of oxide during the thermal oxidation cycle. Once the thick regions of oxide have been grown, which include thick region 121, the remaining nitride and underlying pad oxide 120 are removed. The thin oxide layer 120 is then grown on the exposed surface 118 of the substrate 112 to form the structure as illustrated in FIG. 6.

In an alternative embodiment, the drift region 119 (drain extension 119) is formed using a mask before the thick oxide region 121 is formed. In this embodiment, after the drift region is formed, a layer of relatively thick oxide 116 is deposited over the entire surface 118 of the substrate 112. This is similar to that illustrated in FIG. 4. Portions of the thick oxide layer 116 are then removed to form the thick region 121. Other thick regions of oxide are also formed at this time for use in forming device regions for other devices in the integrated circuit (not shown). Moreover, these other thick regions (not shown) can be used as masks to define the region comprising the MOSFET 100. Thereafter, the thin oxide layer 120 is grown. In one embodiment, the thin oxide layer 120 is formed by oxidation of the substrate 112. The net result of this embodiment is illustrated in FIG. 6.

Figure 7:
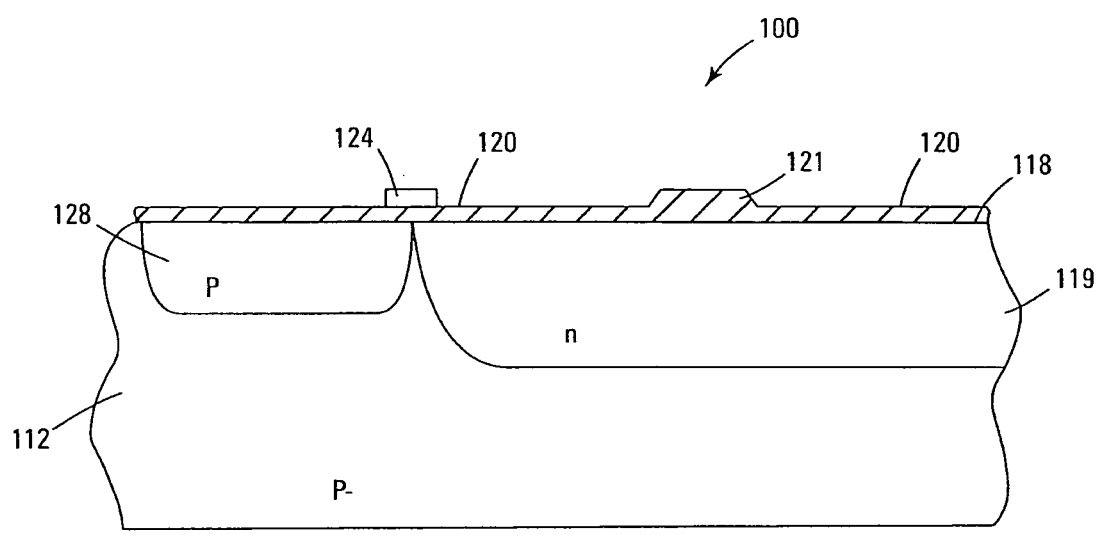

As shown in FIG. 7, a poly silicon MOSFET gate 124 is deposited overlying a portion of the relatively thin region 120. The MOSFET gate 124 can be referred to as a gate 124, a gate electrode 124 or as gate material 124. A P type body 128 is formed by masking the remainder of the MOSFET 100 and implanting P type dopants through the thin oxide 120 using the left edge of gate 124 as a self-aligned masked edge.

Figure 8:
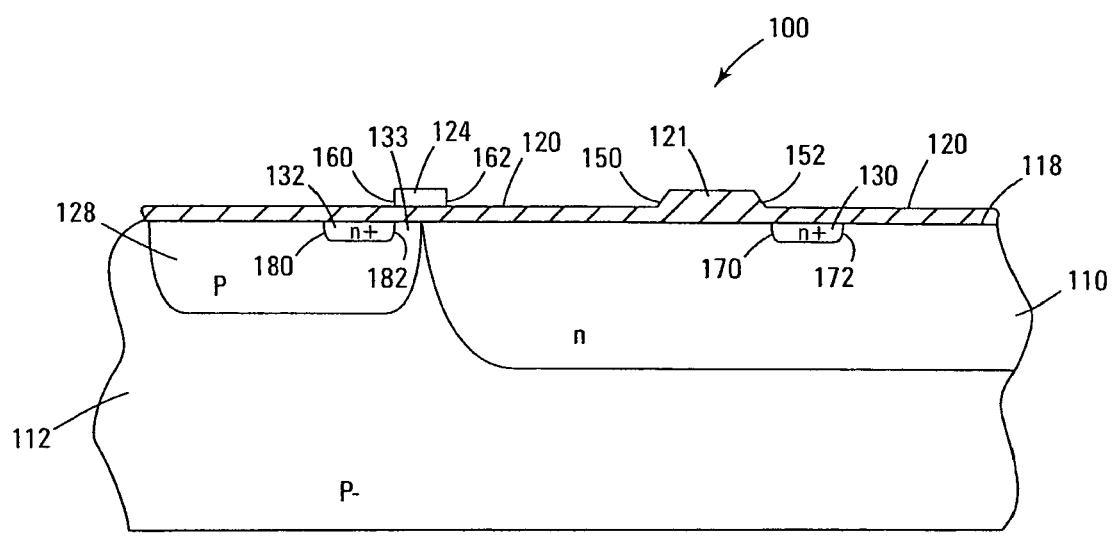

Referring to FIG. 8, a drain region 130 and a source region 132 are formed. The drain region 130 and the source region 132 are formed by implanting N+ dopants through the thin oxide layer 120. In particular, a second edge 152 of thick region 121 serves as a self-aligned mask during formation of the drain region 130 to form a first edge 170 of the drain region 130 and a photo resist mask is used to define a second edge 172 of the drain region 130. In addition, a first edge 160 of MOSFET gate 124 serves as a self-aligned mask during formation of the source region 132 to form a second edge 182 of the source region 132 and the photo resist mask is used to define a first edge 180 of the source region 132. Typically, the drain region 130 and the source region 132 are formed at the same time. FIG. 8 also illustrates a MOS channel region 133 within the P body 128.

Figure 9:
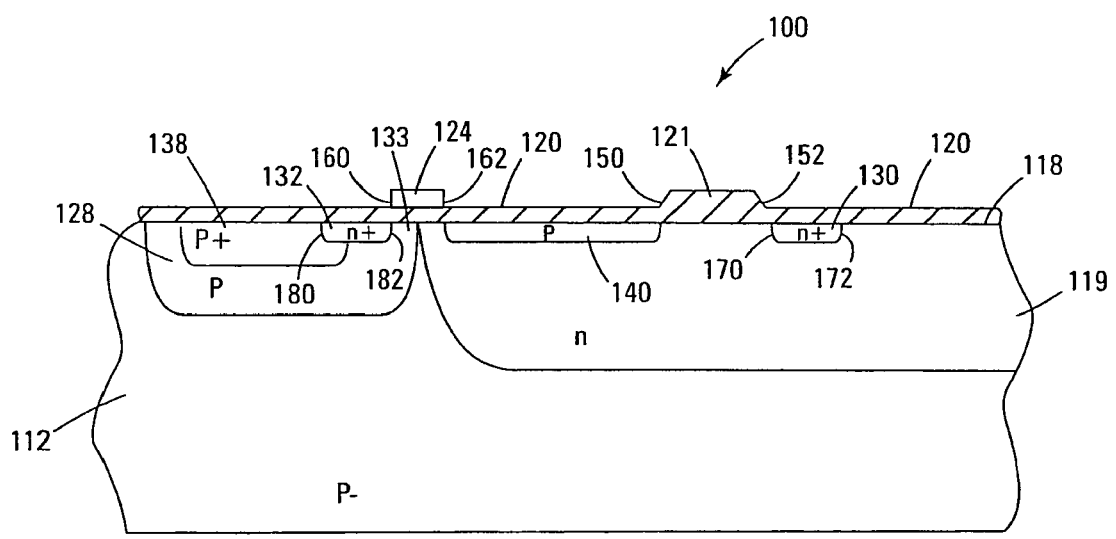

As shown in FIG. 9, a P+ body contact 138 is formed in the P body 128 by implanting high density P type dopants through the thin oxide layer 120. It is known by those skilled in the art that the source and drain regions 132 and 130, respectively, can be formed either before or after formation of the P+ body contact 138. A P type dopant is implanted through the thin oxide layer 120 to form the top gate 140. A second edge 162 of the MOSFET gate 124 and the first edge 150 of the relatively thick region 121 serve as self-aligned mask edges for forming the top gate 140. The width of the thick oxide region 121 is established to create the desired lateral spacing between the top gate 140 and the drain region 130.

Figure 10:
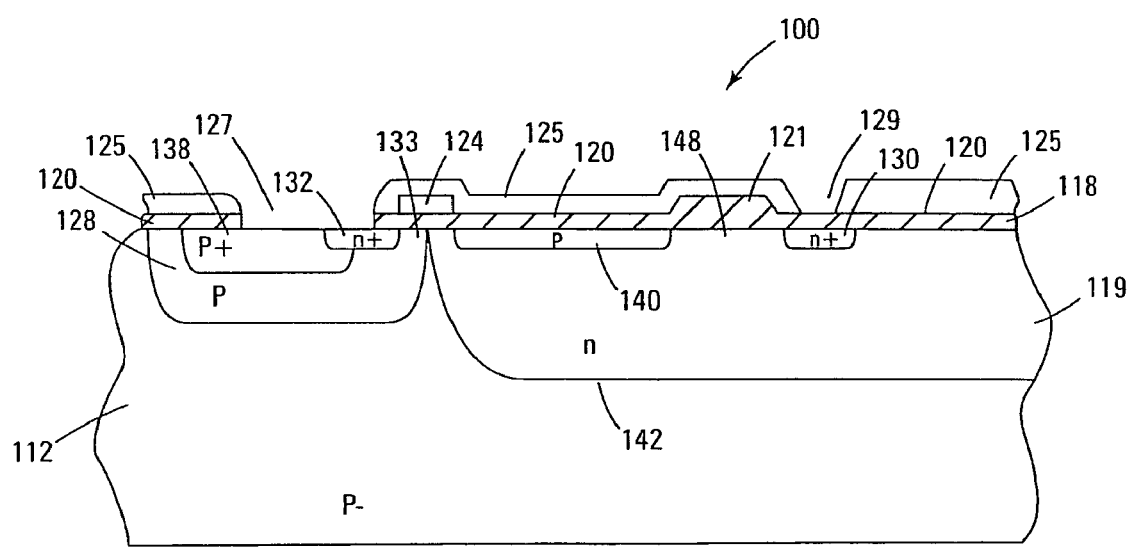
Figure 10A:
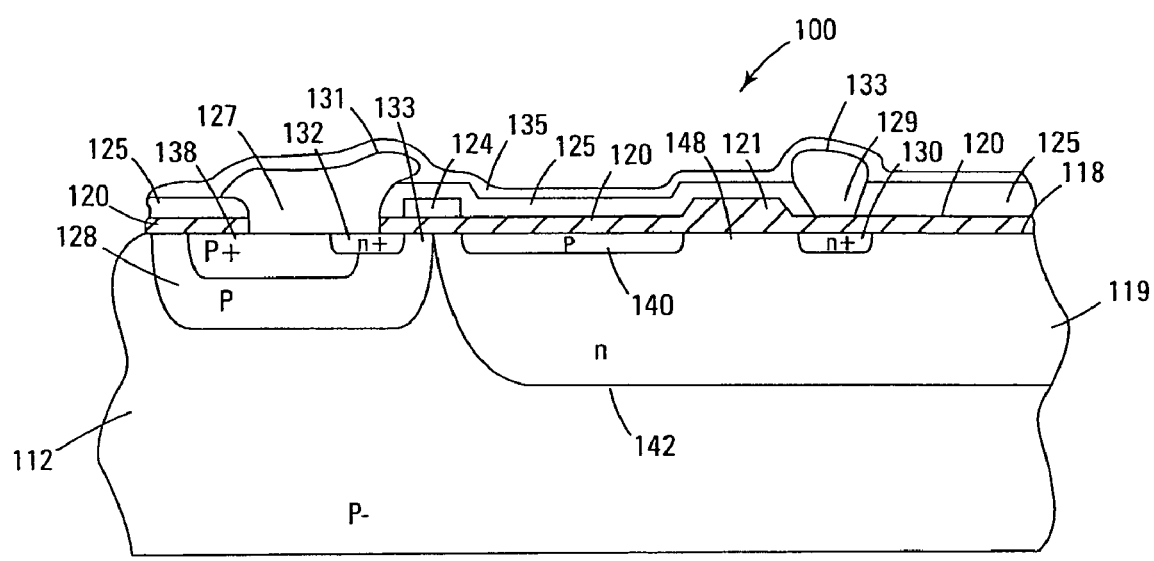

Referring to FIG. 10, a second layer of dielectric 125 is deposited on the substrate 112 to provide another insulation layer. In one embodiment the second layer of dielectric is a second layer of oxide 125. Selected regions of the relatively thin oxide layer 120 and the second layer of oxide 125 are etched and removed to form a first opening 127 adjacent the body 128 and source 132 and a second opening 129 adjacent the drain contact 130. As illustrated in FIG. 10A, a body-source metal conductor 131 is formed in the first opening 127 and a drain contact conductor 133 is formed in the second opening 129. In one embodiment, the body-source metal conductor 131 and the drain contact conductor 133 are made of Aluminum. Also illustrated, is a protective layer of passivation 135 formed over the MOSFET 100.

The MOSFET 100 of FIG. 10, operates like MOSFET 90 of FIG. 3. In particular, the top gate 140 functions as a JFET top gate as does the top gate 53 of FIG. 3. Moreover, region 142 of the substrate 112 serves as the JFET bottom gate 66 of FIG. 3. The process according to the present invention for creating the top gate 140 allows for accurate control of the distance 148 shown in FIG. 10 without the requirement for mask alignment tolerances and with few or no additional masking steps.

Figure 11:
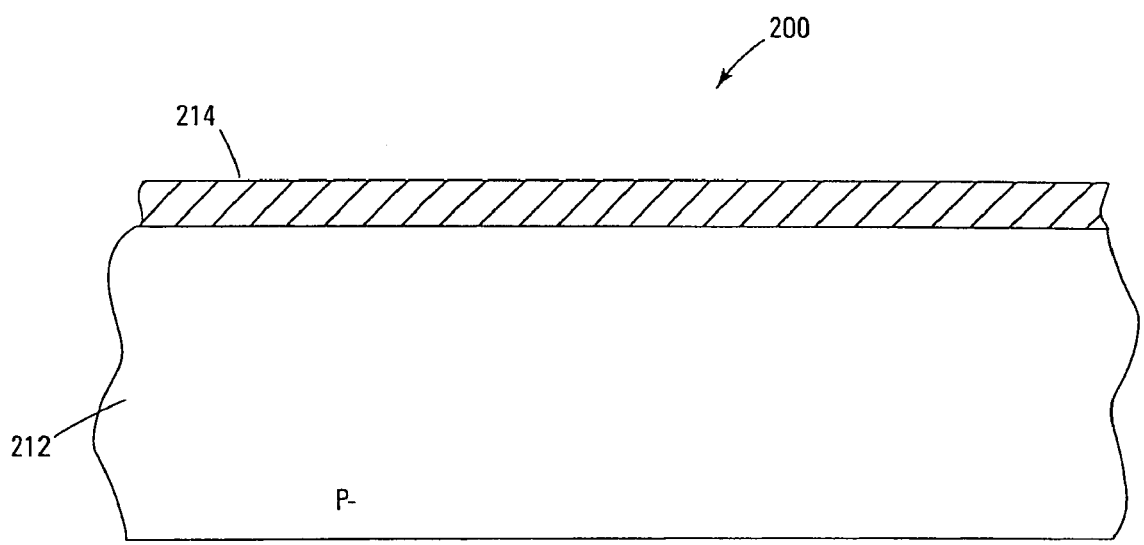
FIGS. 11 through 18A illustrate, in a cross-section view, embodiments of the present invention during sequential fabrication steps.
Figure 12:
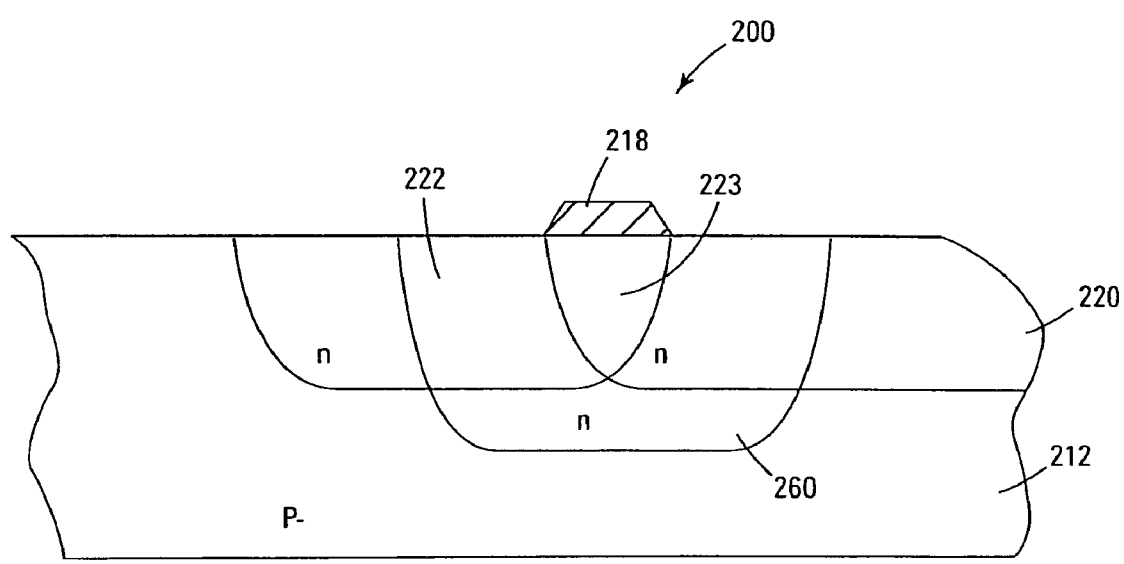
Figure 15:
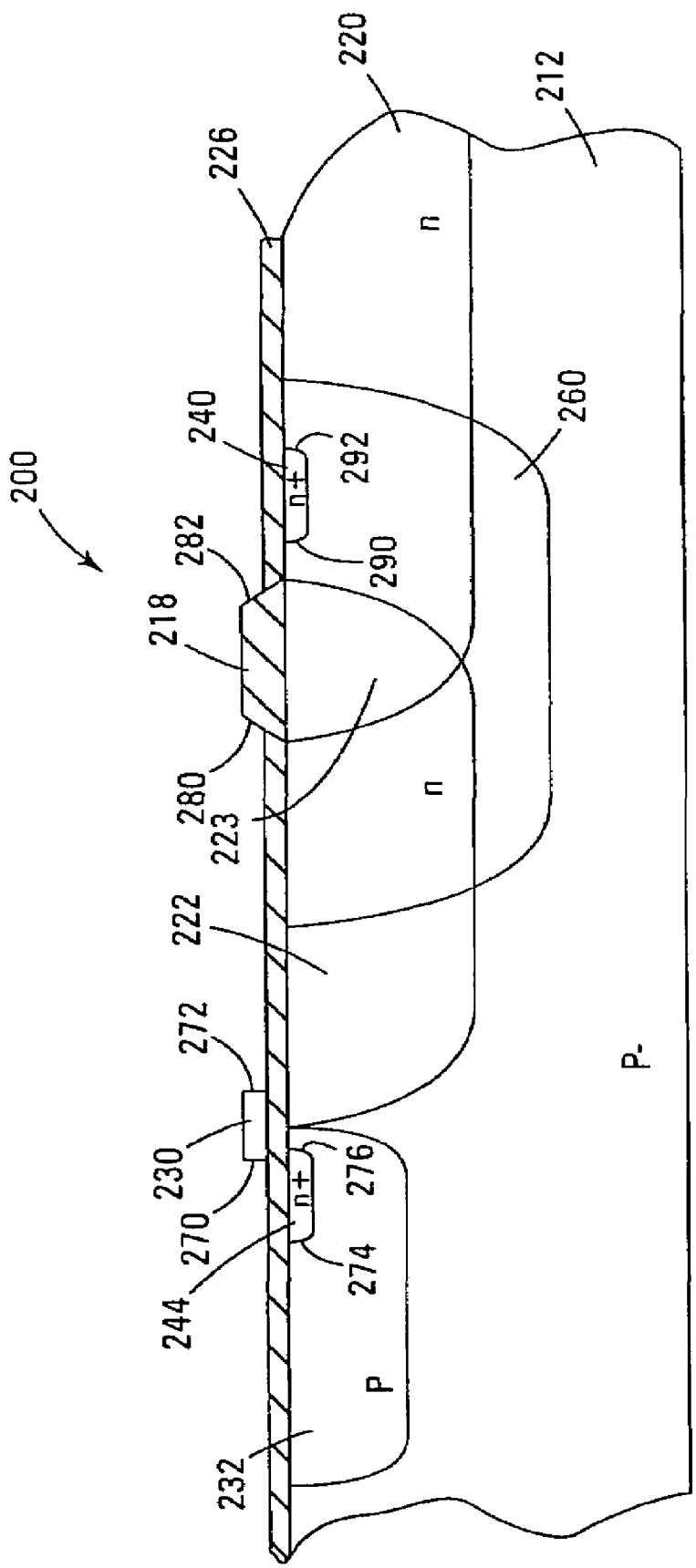

In another embodiment of the process according to the present invention, MOSFET 200 is fabricated. A relatively thick oxide layer 214 is first formed overlying a substrate 212, as illustrated in FIG. 11. The field oxide layer 214 is patterned using conventional etch processes, to create a relatively thick oxide region 218, as illustrated in FIG. 12. Two drain drift regions 220 and 222 (or n type regions 220 and 222) are formed by implanting n type dopants into the substrate. In this embodiment, the space between the first drift region 220 and the second drift region 222 is generally defined by the width of the relatively thick oxide region 218. In one embodiment, drift regions 220 and 222 are formed by masked diffusion. In this embodiment, during this diffusion process, the dopants diffuse laterally from the N type regions 220 and 222, creating an overlap region 223 (or third N region 223) below the relatively thick oxide region 218, as illustrated in FIG. 12. This creates a single main drain drift region 220, 222 and 233 that extends from a gate electrode 230 past a drain contact 240. This is illustrated in FIG. 15. The drain contact 240 can be referred to as a drain region 240.

Figure 13:
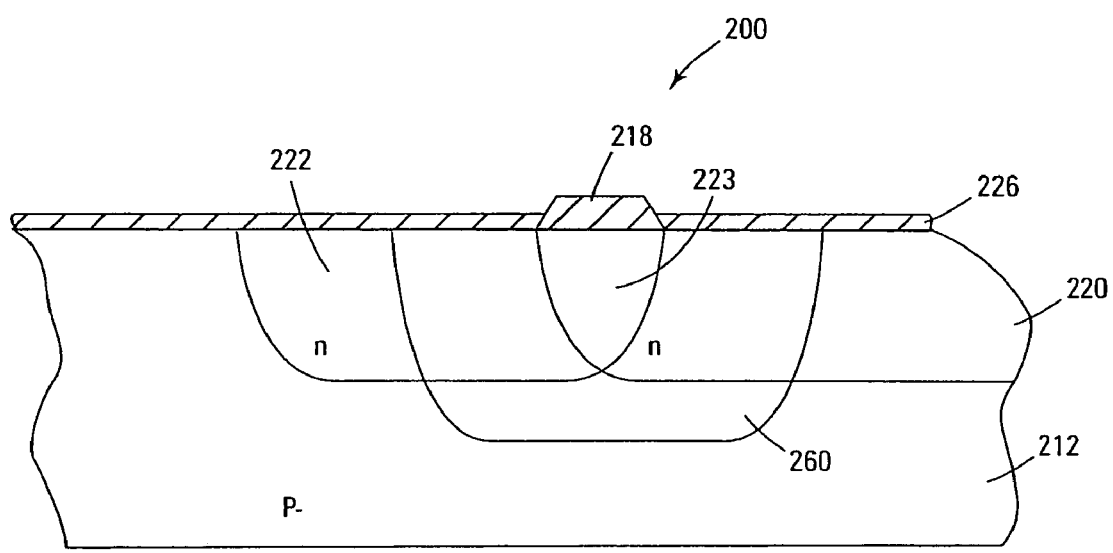

Since, the dopant concentration in the overlap region 223 is created by lateral diffusion, it has a lower dopant concentration than that in the n-type drift regions 220 and 222. Overlap region 223 therefore introduce an undesirable region of high resistance within drift regions 220 and 222. In one embodiment, this resistance is reduced by adding a N region 260, as illustrated in FIG. 13. The overlap region 223 is positioned within the N region 260 as illustrated. Preferably N region 260 is one N well of several N wells formed at different locations within the integrated circuit. Low voltage PMOS devices may then later be formed in these other N wells in the integrated circuit. In this way, N region 260 can be formed simultaneously with the formation of PMOS wells at other locations in the integrated circuit. N region 260 is formed prior to the formation of drift regions 220 and 222.

Figure 14:
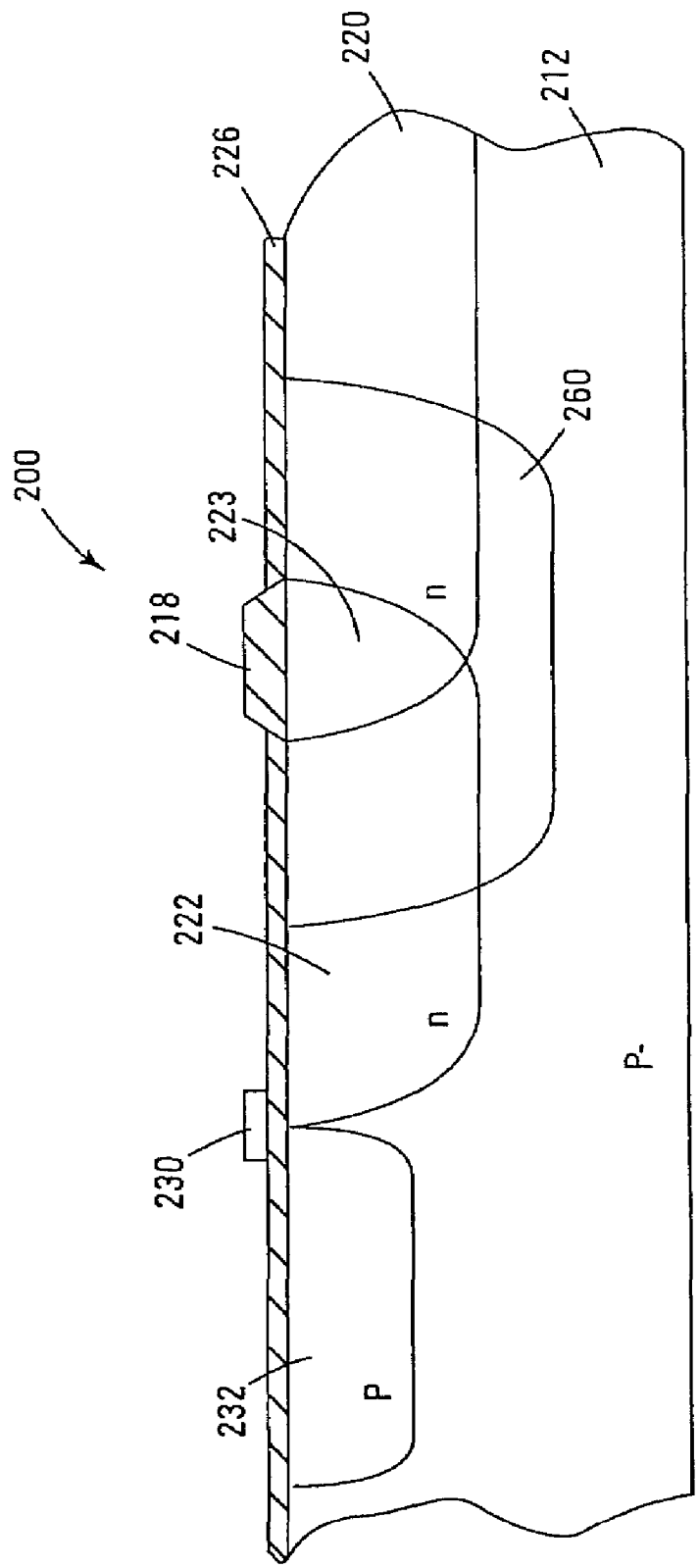

As also shown in FIG. 13, a relatively thin oxide layer 226 is then grown on the substrate 212, which, as is know by those skilled in the art, also causes the thick region 218 to grow thicker, but at a slower rate than the growth of new oxide. Referring to FIG. 14, a gate 230 is formed over a region of the relatively thin oxide layer 226. P type dopants are implanted and diffused through the relatively thin oxide layer 226 to form a P type body region 232 in the P– substrate 212.

Figure 16:
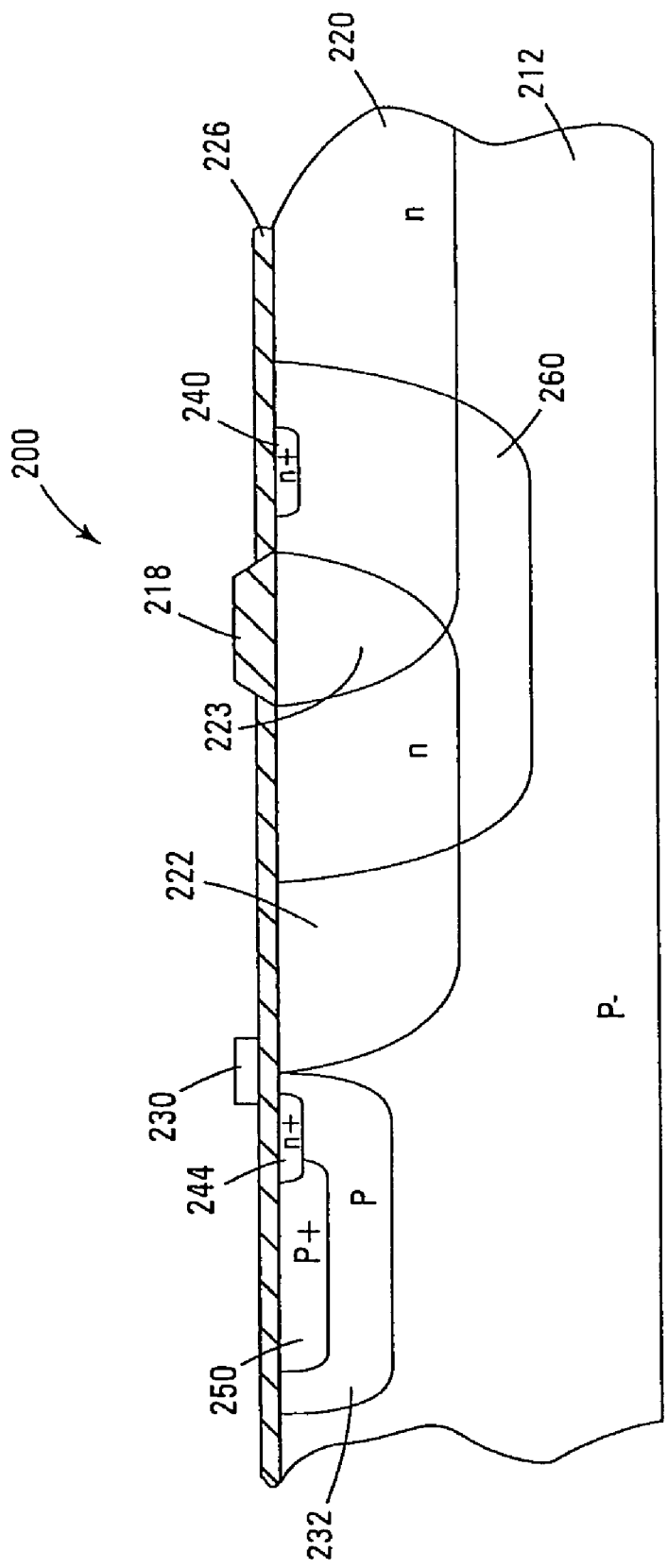

Referring to FIG. 15, a N+ drain region 240 and a N+ source region 244 are formed by an implant of N+ dopants through the relatively thin oxide region 226. In particular, a mask is used in forming a second edge 292 of the N+ drain region 240 and a first edge 290 of the N+ drain region is formed by the use of a second edge 282 of the relatively thick oxide region 218 as a self-aligned mask. In addition, a mask is used to form a first edge 274 of the N+ source region 244 and a first edge 270 of gate 230 is used as a self-aligned mask to form a second edge 276 of the N+ source region 244. As illustrated in FIG. 16, a P+ body contact region 250 is formed in the P body region 232 by implanting P+ dopants through the relatively thin oxide layer 226.

Figure 17:
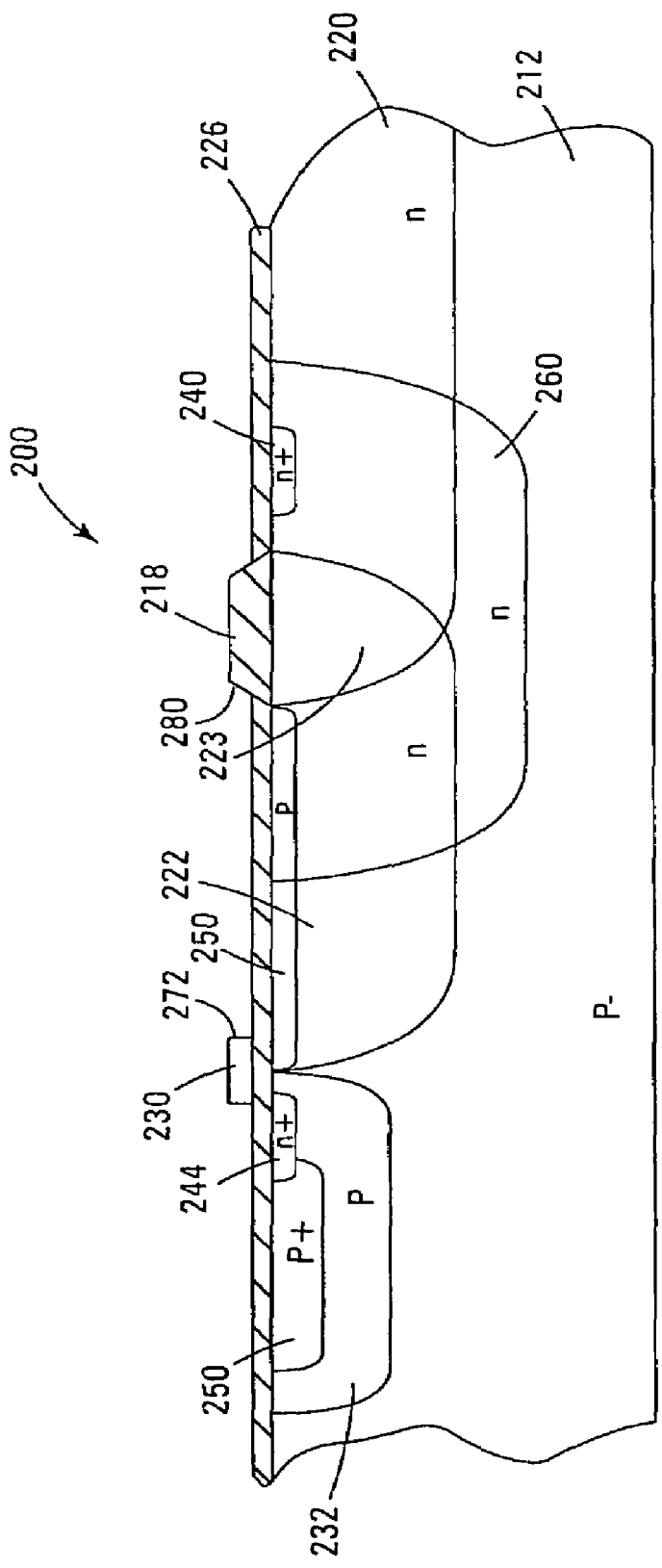

A P type top gate 250 is formed by an implant of P type dopants through the relatively thin oxide layer 226. The top gate 250 is illustrated in FIG. 17. The top gate 250 is self-aligning to the first edge 280 of the relatively thick oxide region 218 and the second edge 272 of the gate 230.

Figure 18:
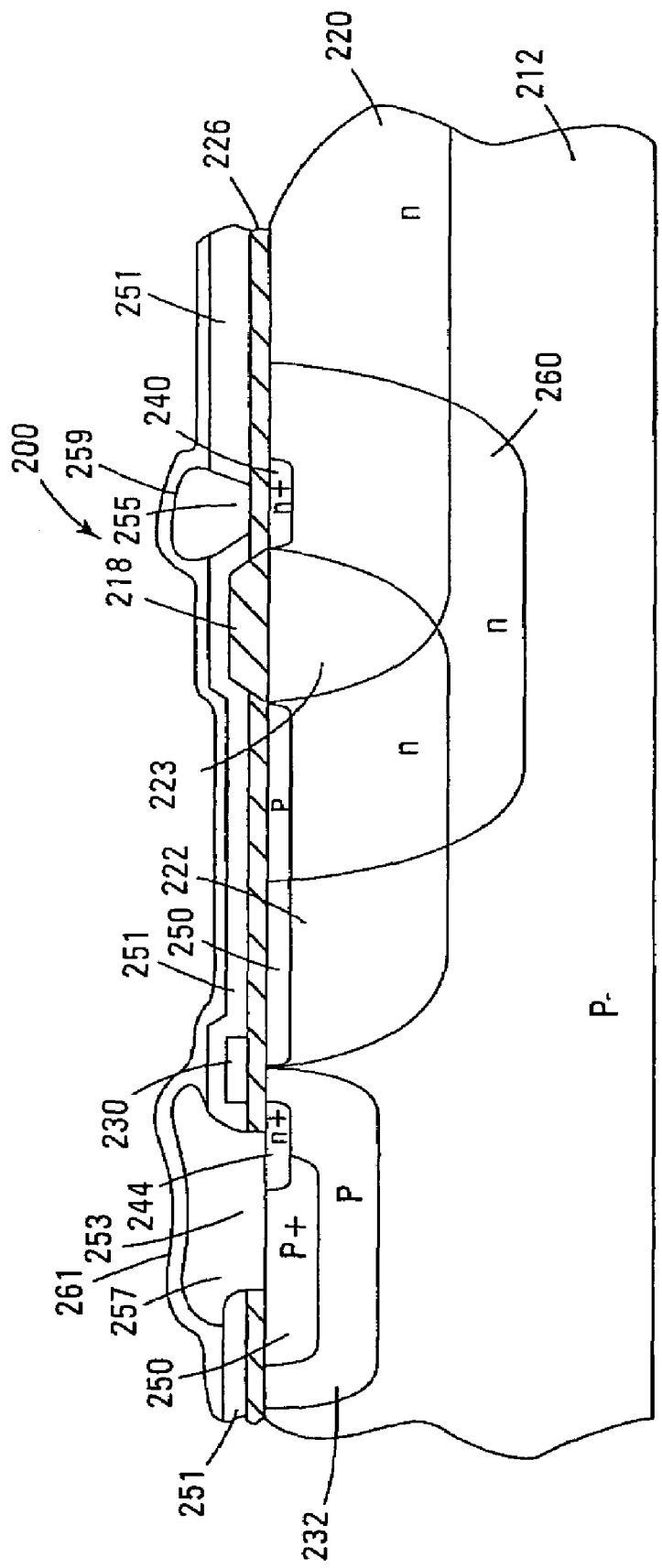

Referring to FIG. 18, a second layer of dielectric 251 is deposited on the substrate 212 to provide another layer of insulation. In one embodiment, the second layer of dielectric 251 is a second layer of oxide 251. Selected regions of the relatively thin oxide layer 226 and the second layer of oxide 251 are etched and removed to from a first opening 253 adjacent the body 232 and the source 244 and a second opening 255 adjacent the drain contact 240. A body-source conductor 257 is formed in the first opening 253 and a drain conductor 259 is formed in the second opening 255. In one embodiment, the body-source conductor 257 and the drain conductor 259 are made of Aluminum. Also illustrated is a protective layer of passivation 261 formed over MOSFET 200.

Figure 18A:
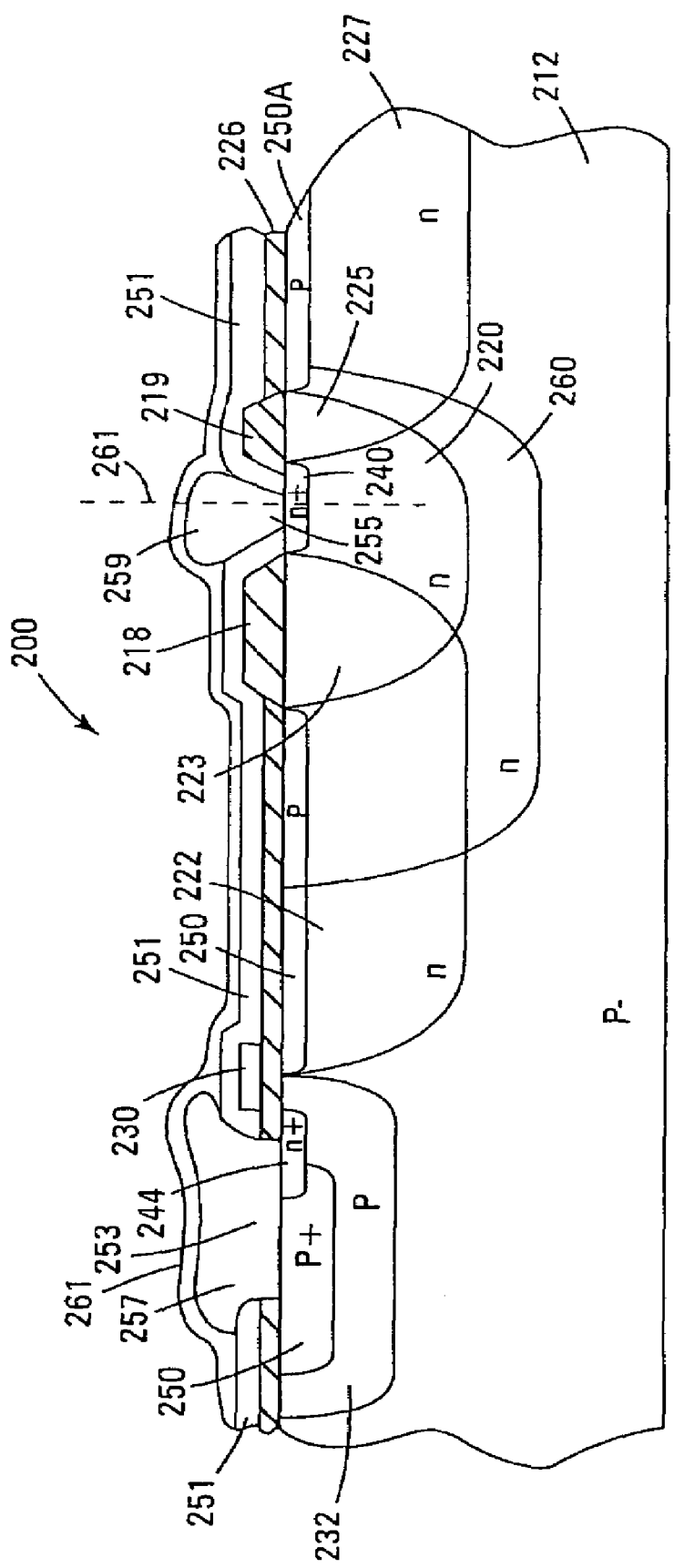

Referring to FIG. 18A, MOSFET 200 is illustrated a configuration typically formed in an integrated circuit structure. In particular, FIG. 18A illustrates two strips of a single multistripe device in an integrated circuit. The N+ drain region 240 is a centerline 261 for adjacent top gates 250 and 250A. In this embodiment, a second thick region 219 is formed to define the distance between the drain contact 240 and top gate 250A the same way, and at the same time, the first relatively thick region 218 is formed. As illustrated, drift region 220 is masked by the second thick region 219. However, when the N type dopents are introduced into the substrate 212 and diffused, overlap drift region 225 under the second thick region 219 and drift region 227 are formed, thereby creating a continuous single drift region that comprises drift regions 222, 223, 220, 225 and 227.

In one embodiment, the high resistance within overlap regions 223 and 225 is reduced by adding a well 260 (or N region 260) of the second conductivity type in the substrate, as illustrated in FIG. 18A. In this embodiment, well 260 extends from top gate 250 to top gate 250A. Well 260 is formed prior to the formation of N type regions 220, 222 and 227. Once well 260 is formed, the fabrication process continues with steps illustrated in FIGS. 12 through 18.

Figure 19:
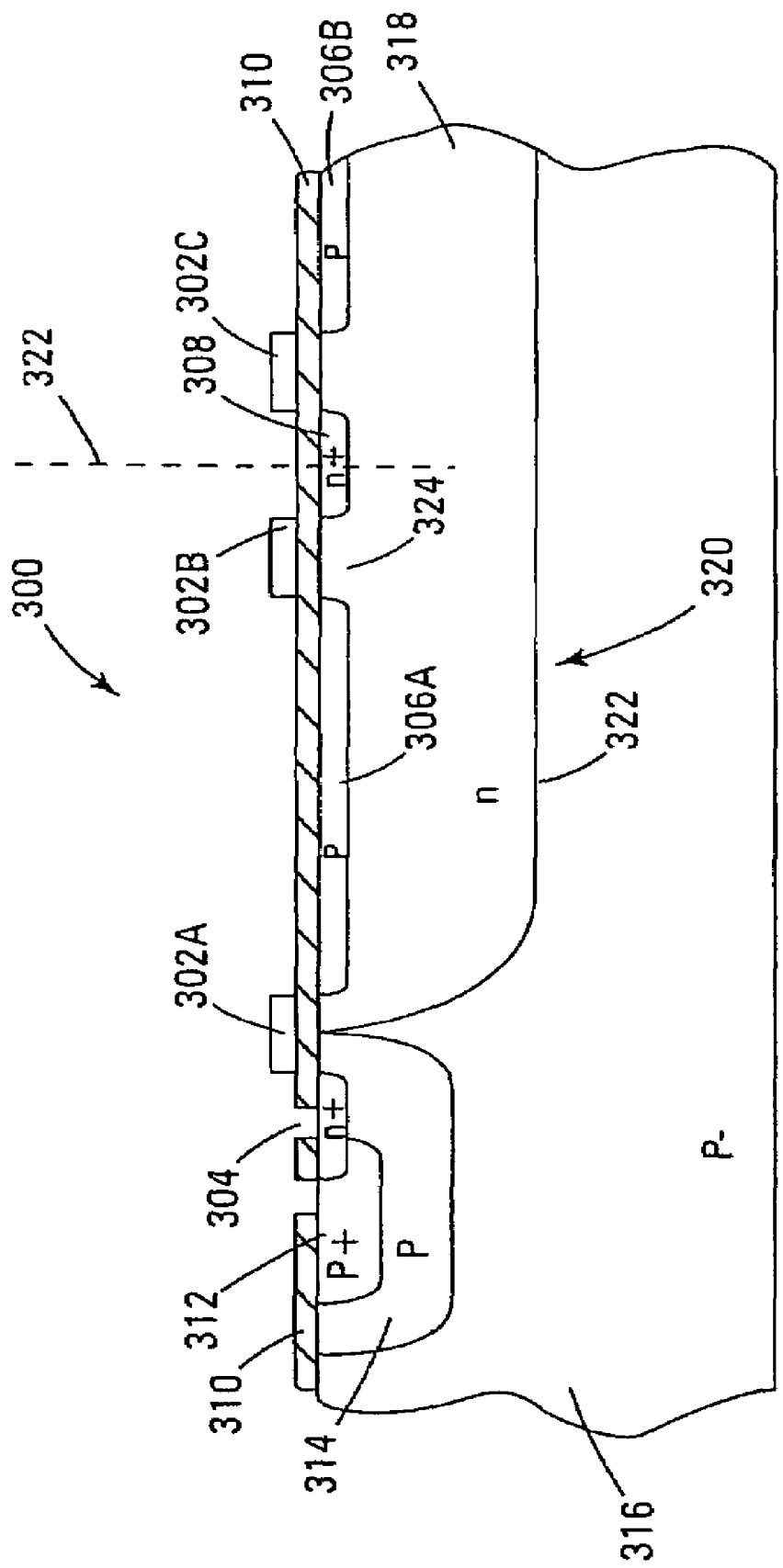
FIG. 19 is a cross-section view illustrating the use of gate material as a mask of one embodiment of the present invention.

Another embodiment of a MOSFET 300 is illustrated in FIG. 19. In this embodiment, a JFET top gate 306A can be accurately spaced apart from the drain region 308 using a strip of gate material. The strip of gate material is patterned to form the MOSFET gate 302A, a first gate material layer 302B and a second gate material layer 302C. In one embodiment, the strip of gate material 302(A-C) comprises poly silicon. Gate material layers 302B and 302C serve as masks for the opposing edges of the drain region 308 and gate layers 302A and 302B serve as masks to form the JFET top gate 306A. In one embodiment, a drain lateral extension 318 is formed, followed by formation of gate material layers 302(A-C). Gate material layers 302B and 302C can be left floating so that their potential is determined by capacitive coupling to adjacent metal layers, or alternatively, they can be connected to the drain region 308. This biasing of the gate material layers 302A and 302B, reduces degradation of breakdown of the MOSFET 300.

Following formation of gate material layers 302(A-C), processing continues with the various fabrication steps illustrated in FIGS. 7 through 10. As illustrated in FIG. 19, the MOSFET 300 also includes a substrate 316, a drift region 318, a body region 314, a body contact 312 and a relatively thin layer of dielectric 310. In one embodiment, the layer of dielectric 310 is a relatively thin layer of gate oxide 310. In addition, to minimize the area consumed by the gate material layers 300(A-C) in an integrated circuit, the source and drain regions 304 and 308 are typically constructed in alternating opposed orientations such that a centerline 322 of a multi-striped device passes through drain region 308. Thus, with respect to FIG. 19, for a first strip of the device to the left of the centerline 322, drain region 308 is associated with top gate 306A and source region 304. For a second strip of the device to the right of the centerline 322, drain region 308 is associated with top gate 306B. Moreover, the second strip of the device to the right of the centerline 322 will also have an associated source region (not shown) to the right of top gate 306B.

With the fabrication process utilizing the gate material layers 302(A-C), two alignment tolerances are removed from the process. Since, gate 302A and gate material layers 302B and 302C are formed simultaneously by a single mask, the length of top gate 306A is established by the distance between gate 302A and gate material layer 300B. Further, the width of the gate material layer 302B determines the spacing between the top gate 306A and the drain region 308. Thus two alignment tolerances have been removed and the need for a separate masking step to space the top gate 306A from the drain region 308 has been eliminated. Moreover, in one embodiment, a strip of gate material can also be utilized in lieu of the thickened oxide region 218 of FIG. 12, to form N type regions 220 and 222 in MOSFET 300.

Figure 19A:
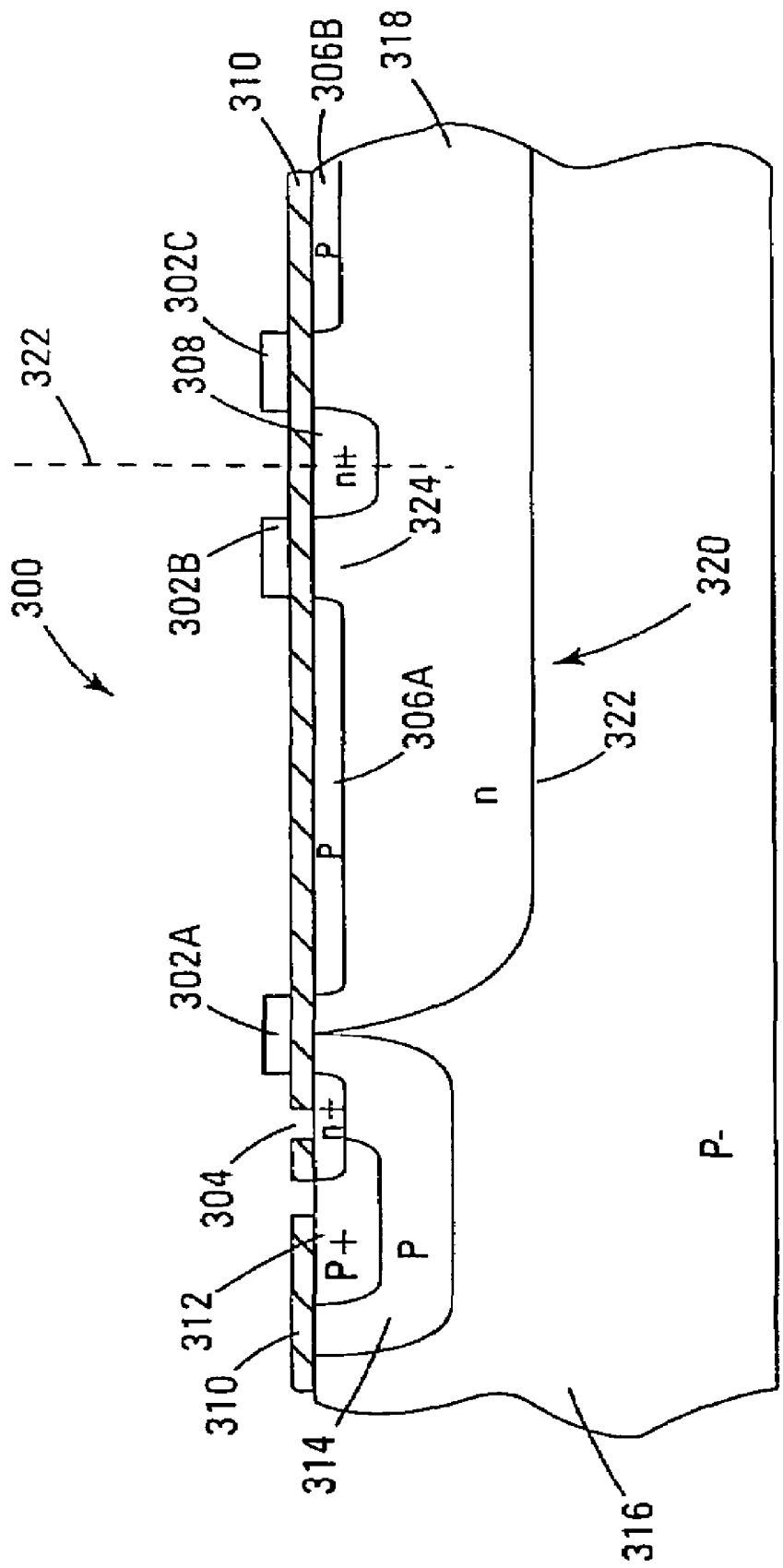
FIG. 19A is a cross-sectional view illustrating drain and contact regions formed deeper than the top gate of one embodiment of the present invention.

In yet another embodiment of the invention, the need for a specific masking step to form the JFET top gate 306A can be avoided by selective design of the drain region 308, source region 304 and the JFET top gate 306A. That is, a mask used to prevent the implantation of dopants used to form top gate 306A in other areas of the substrate 316 can be eliminated by selective design. In particular, when drain region 308 and source region 304 are formed deeper than the top gate 306A and also have a higher doping density at every depth than the top gate 306A, then a mask is not required to form the latter. This is illustrated in FIG. 19A. With this embodiment, the P type implant for forming the top gate 306A can be permitted to diffuse into the drain region 308 and the source region 304, where it will be overcompensated by the heavier and deeper N+ concentration. If the top gate 306A is formed deeper than the drain region 308 and the source region 304, and is permitted to diffuse into the drain region 308, then the P diffusion will form a P type layer under the N+ drain region 308. Thus the N+ drain region 308 is isolated from the drain lateral extension 318, to which it must be ohmically connected. Using this alternative process to form the drain region 318 and the top gate 306A, eliminates one masked step from the fabrication sequence for the MOSFET device 300. This embodiment can also be applied to MOSFET 100 of FIG. 10 and MOSFET 200 of FIG. 18A.

Figure 19B:
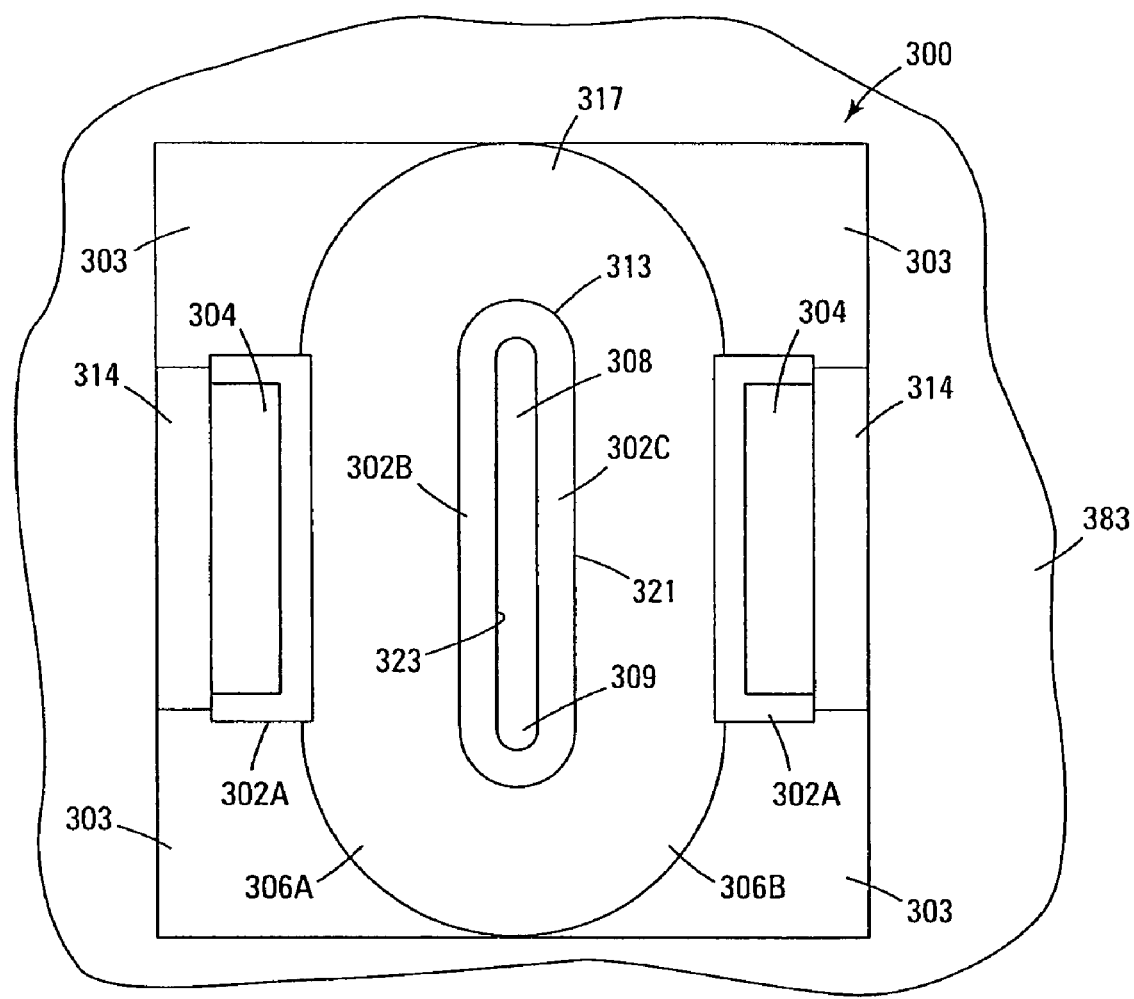
FIG. 19B is a top view of one embodiment of a MOSFET of the present invention.

Referring back to FIG. 19, gate material layers 302B and 302C are illustrated as two separate areas. In one embodiment, however, a single gate material region 313 is formed in an elliptical shape having a center opening 309. In this embodiment, the gate material region 313 includes gate material layers 302B and 302C. This is illustrated in FIG. 19B. FIG. 19B is a top view of one embodiment of MOSFET 300. As illustrated, the gate material region 313 is used to define the drain region 308. That is, the drain region 308 is defined by an inner perimeter 323 of gate material 313. In addition, gate material 313 defines the lateral space between the top gate 317 (which includes top gates 306A and 306B) and the drain region 308. Also illustrated in the embodiment of FIG. 19B, is the drain region 308 being shared on two sides by gates 302A, source regions 304 and body regions 314. Moreover, FIG. 19B also illustrates the top gate 317 extending around an outside or outer perimeter 321 of gate material layers 302A and 302C (or gate material region 313). FIG. 19B also illustrates additional areas of top gate 303 that are present in the embodiment of FIG. 19A (the embodiment that does not require a separate mask to form the top gate 306A). In one embodiment, a relatively thick oxide layer is used in place of the gate material in gate material region 313. FIG. 19B also illustrates a relatively thick oxide region 383 surrounding MOSFET 300.

Figure 19C:
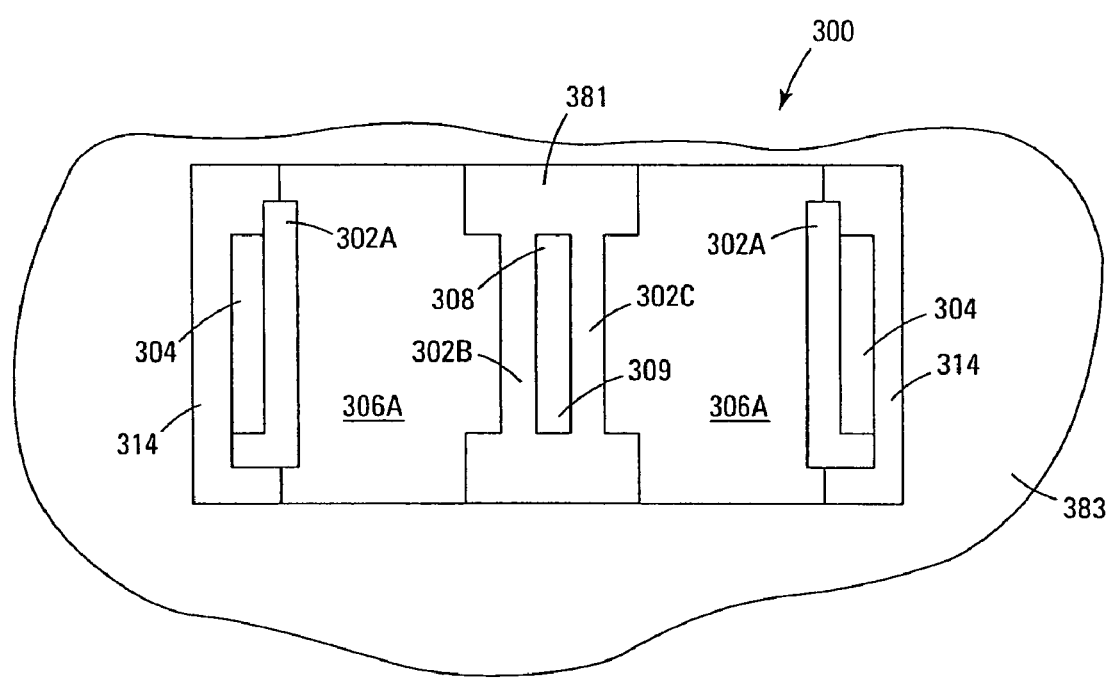
FIG. 19C is a top view of another embodiment of a MOSFET of the present invention.

A top view of another embodiment of MOSFET 300 is illustrated in FIG. 19C. In this embodiment, gate material region 381 includes gate material layers 302B and 302 C. In this embodiment the gate material region 381 is formed in striped shape. Gate material region 381 has a center opening 309 that defines the drain region 308. Moreover, the gate material region 381 defines the lateral distance between the drain region 308 and the top gates 306A. Also illustrated in FIG. 19C are gates 302A, source regions 304 and body regions 314. In yet another embodiment, a relatively thick oxide layer is patterned and used in place of the gate material in gate material region 381. FIG. 19C also illustrates a relatively thick oxide region 383 surrounding MOSFET 300.

As is known by those skilled in the art, there are many applications in integrated circuits for the MOSFETs 100, 200 and 300 described herein. For example, they can be used as linear switches, solid state relays and telecommunications switching circuits. In such applications, two DMOSFET devices have their sources connected directly or through current limiting resistors and their drains serve as the output terminals of the switch.

Figure 20:
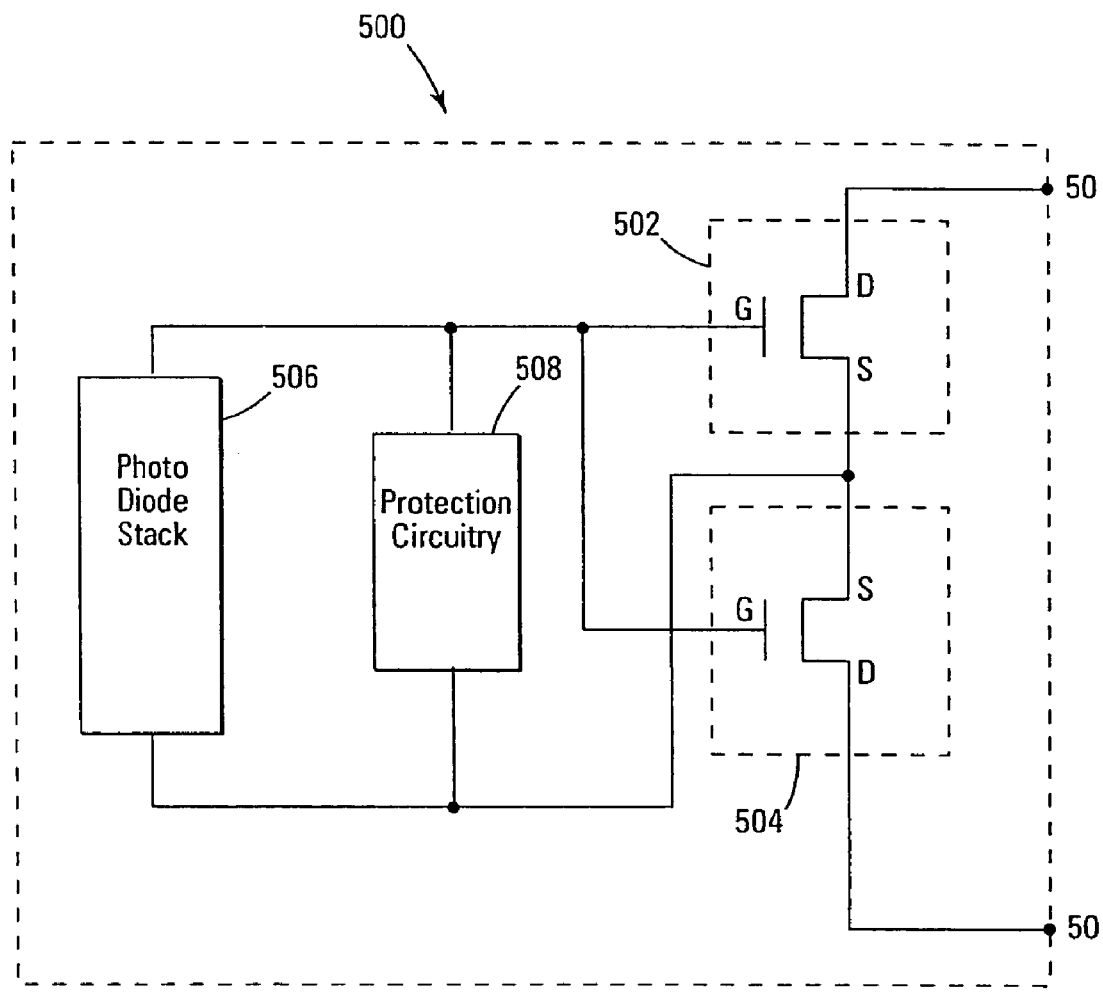
FIG. 20 is a block diagram of a solid state relay incorporating MOSFETs of the present invention.

An embodiment of a solid state relay circuit 500 using a pair of DMOSFET devices 502 and 504 as described above, is illustrated in FIG. 20. As illustrated, the solid state relay circuit 500 includes a photo diode stack 506, a turn off and gate protection circuit 508 and two DMOSFET devices 502 and 504 in an integrated circuit. The photo diode stack 506 is used to drive voltage to the source S and gate G of each DMOSFET 502 and 504. Generally, the photo diode stack 506 is illuminated by a light emitting diode (not shown). The turn off and gate protection circuit 508 is coupled in parallel with the photo diode stack 506 to discharge any gate-source capacitance when the photo diode is not driving voltage to the source S and gate G of each DMOSFET 502 and 504. As illustrated, drain D of DMOSFET 502 is coupled to switch terminal S0. Moreover, drain D of DMOSFET 504 is coupled to switch terminal S0'.

Photo diodes in the photo diode stack 506 have open circuit voltage and a short circuit current when illuminated. A set of N photo diodes are connected in series to form the photo diode stack 506. An open circuit voltage of the diode stack will be N times the open circuit voltage of a single photo diode. Moreover, the short circuit current of the photo diode stack 506 is equal to that of a single photo diode. Typically, an open circuit voltage of approximately 0.4V and a short circuit current of approximately 100 nA is produced by the solid state relay 500. A load comprising the gate capacitances of the two DMOSFET devices 502 and 504 is coupled to the photo diode stack 506 in the solid state relay 500. The gate capacitance is shunted by the turn off and gate protection circuitry 508 coupled in parallel with the photo diode stack 506. An equilibrium gate source voltage of the DMOSFET devices 502 and 504 in an off condition is 0V.

When the light emitting diode is turned on, illuminating the photo diode stack 506, the short circuit current of the photo diode stack 506 begins to charge the gate capacitance of DMOSFET devices 502 and 504. A gate-source voltage of each DMOSFET devices 502 and 504 rises as the respective gate capacitance charges until reaching the stack open circuit voltage. The number of photo diodes in the photo diode stack 506 is chosen such that its open circuit voltage is larger that the threshold voltages of the DMOSFET devices 502 and 504. Consequently, the DMOSFET devices 502 and 504 turn on when the stack is illuminated thereby presenting the ON resistance of the DMOSFET devices 502 and 504 in series with the switch terminals S0 and S0'.

DMOSFET device 502 and 504 are coupled in series to form a switch to block relatively large voltages, of both polarities, across the switch terminals S0 and S0' when the switch is off. This exploits the fact that the DMOSFET devices 502 and 504 each have asymmetric breakdown with the drain to source breakdown being relatively large while the source to drain breakdown is relatively small (often as small as a diode forward voltage). By having the DMOSFET devices 502 and 504 coupled in series, the drains D of the devices 502 and 504 are coupled to their associated switch terminals S0 and S0'. When switch terminal S0 has a positive voltage that is more positive than the voltage on switch terminal S0', the drain junction of the DMOSFET device 502 blocks the applied voltage. Moreover, when switch terminal S0' has a positive voltage that is more positive that the voltage on switch terminal S0, the drain junction of DMOSFET device 504 blocks the applied voltage.

Turn off of the solid state relay 500 is initialized when the LED is turned off. An output current of the photo diode stack 506 then goes to 0V. The turn off and gate protection circuit 508, which in its simplest form may comprise a relatively large resistor, discharges the gate capacitance of gate G of the DMOSFET devices 502 and 504 thereby taking the gate source voltage back to 0V on both DMOSFET devices 502 and 504.

Figure 21:
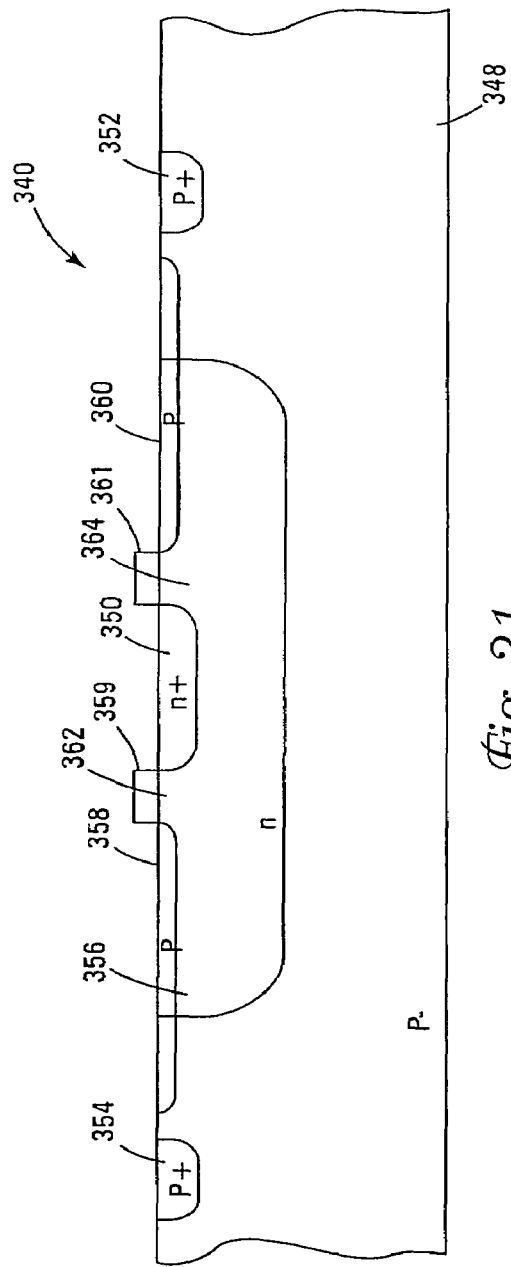
FIG. 21 is a cross-sectional view of a pn junction diode for an integrated circuit of one embodiment of the present invention.

The teachings of the present invention can also be applied to the fabrication of pn junction diodes in integrated circuits that are fabricated with a diffusion region 356, as illustrated in FIG. 21. The embodiment illustrated in FIG. 21, shows a substrate 348 and a pn junction diode 340 formed in substrate 348 of the integrated circuit. The pn junction diode 340 comprises a cathode contact 350 (doped N+) and two P+ anode contact regions 352 and 354 in an anode 348 (the substrate 348). A cathode 356 and two JFET top gate regions 358 and 360 are also illustrated. As illustrated, the cathode 356 extends laterally from a portion of top gate 358 to a portion of top gate 360. With respect to the individual P– and N type regions, they function in a manner identical to their function in the MOSFET devices discussed above.

The teachings of the present invention offer a fabrication technique that eliminates masked alignment tolerances and provides a relatively accurate length for the regions 362 and 364, which are disposed between the cathode contact 350 and the top gates 358 and 360, respectively. Thus, the technique described with respect to FIGS. 4 through 10 (teaching the use of a thick oxide region as a mask, thick oxide regions 359 and 361 of FIG. 21), FIGS. 11 through 18A (teaching the use of two overlapping n-type diffusions to form a drift region 356, which in this case is a N type cathode region 356) and FIGS. 19-19A (teaching the use of a gate layer material as a mask instead of a relatively thick oxide or dielectric layer) can be applied to the structure of FIG. 21. As is known by those skilled in the art, the structure of FIG. 21 can also be modified such that the JFET top gates 358 and 360 overlap or abut the P+ anode contact regions 352 and 354, respectively.

Figure 21A:
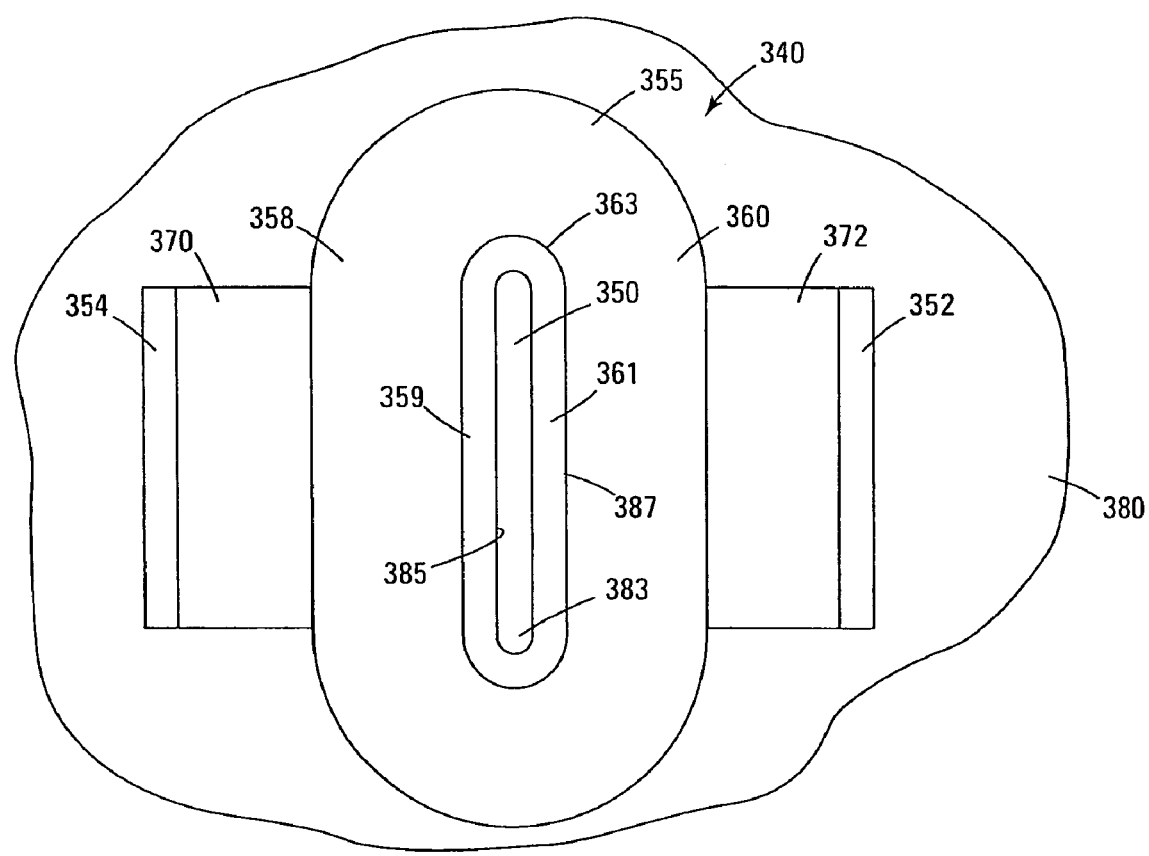
FIG. 21A is a top view of one embodiment of a pn junction diode for an integrated circuit of the present invention.

Referring to FIG. 21A a top view of one embodiment of a pn junction diode 340 is illustrated. As illustrated, in this embodiment, thick oxide region 363 includes thick oxide regions 359 and 361. In particular, ends of the thick oxide regions 359 and 361 are connected together when formed to create a single thick oxide region 363 with a central opening 383. In the embodiment shown, the thick oxide region 363 is formed in an elliptical shape. Moreover, thick oxide region 362 defines the cathode contact 350. In particular an inner perimeter 385 of the thick oxide region 363 defines the cathode contact 350. In addition, the thick oxide region 363 also defines the lateral distance between the cathode contact 350 and top gate region 355. In this embodiment, top gate region 355 includes top gate regions 358 and 360 of FIG. 21. That is, top gate regions 358 and 360 form the single top gate region 355. Top gate region 355 extends around an outer perimeter 387 of the thick oxide region 355. Also shown in FIG. 21A are the anode contact regions 352 and 354. In one embodiment, top gate regions 370 and 372 are also included. In addition, as illustrated, a layer of relatively thick oxide 380 surrounds the pn junction diode 340.

Figure 22:
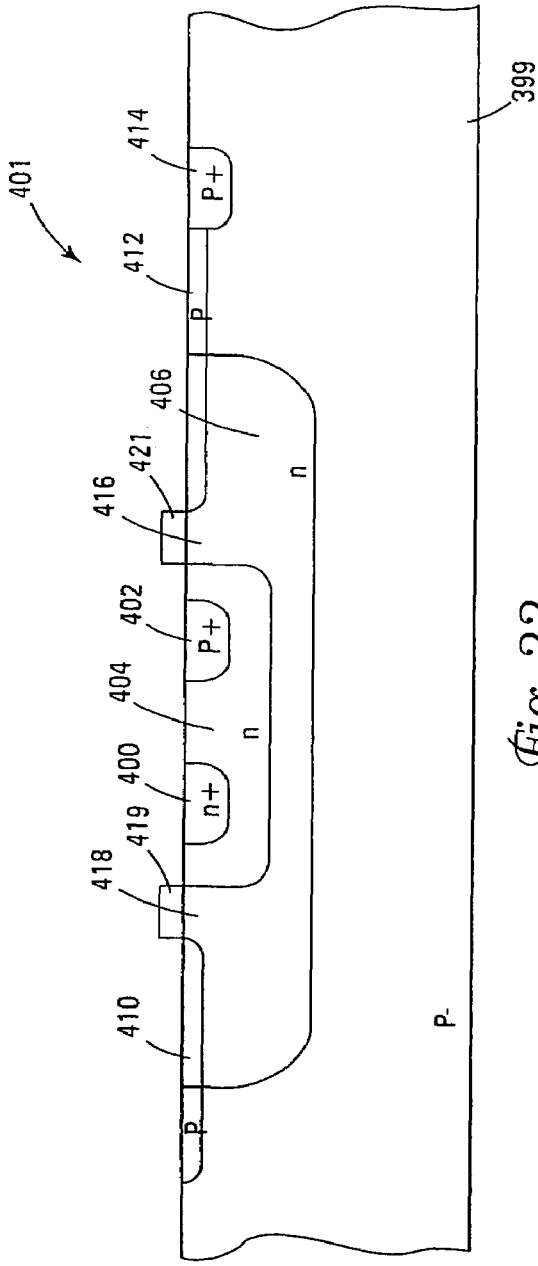
FIG. 22 is a cross-sectional view of a bipolar transistor for an integrated circuit of one embodiment of the present invention.

The teachings of the present invention can also be applied to a high voltage PNP bipolar junction transistor 401 formed in an integrated circuit as illustrated in FIG. 22. The transistor regions are formed in a substrate 399 of the integrated circuit and comprise a base contact 400 and an emitter 402 disposed within a base region 404. An extension region 406 (which in one embodiment can be made shallower than the base region 404) is also illustrated. The transistor 401 also comprises two p-type extension regions or JFET top gates 410 and 412. The JFET top gates 410 and 412 are actually separate parts of a single gate that is formed in a semi-circular shape in the substrate 399. A collector contact 414 is also shown. The teachings of the present inventions as discussed above can be advantageously utilized to accurately space the base region 404 from the P-type extension 410 and 412. In particular, FIGS. 4 through 10 (which teach the use of a relatively thick dielectric region as a mask to accurately dimension the distances 416 and 418 of FIG. 22). FIG. 22 illustrates relatively thick dielectric regions 419 and 421 of the PNP junction transistor 401. The relatively thick dielectric regions 419 and 421 are actually separate parts of a single relatively thick dielectric region that is formed into a semi-circular shape to define the base region 404. Other teachings of the present invention as discussed above can also be advantageously utilized in overlapping N type diffusions (as illustrated in FIGS. 11-18A) and using of a gate material layer as a mask (as illustrated in FIGS. 19-19A). Although FIG. 22 illustrates a PNP bipolar junction transistor 401, those skilled in the art recognize that the teachings of the present invention can also be applied to an NPN bipolar transistor of an integrated circuit.

While the invention has been described with reference to preferred embodiments, it will be understood by those skilled in the art that various changes may be made and equivalent elements may be substituted for elements thereof without departing from the scope of the present invention. In addition, modifications may be made to the teachings of the invention to adapt it to a particular situation, without departing from the essential scope thereof. Therefore, it is intended that the invention not be limited to the particular embodiment disclosed as the best mode contemplated for carrying out this invention, but that the invention would include all embodiments falling within the scope of the appended claims.

What is claimed is:

1. A method of forming a pn junction diode in an integrated circuit, the method comprising:
   forming a first region of relatively thick material on the surface of a substrate of a first conductivity type, wherein the first region of relatively thick material is thick enough to mask a selected implant;
   forming a second region of relatively thick material on the surface of a substrate a predetermined distance from the first region, wherein the second region of relatively thick material is thick enough to mask a selected implant;
   implanting high density of dopants of a second conductivity type in the substrate to form a diode contact using first edges of the first and second regions as masks to define edges of the diode contact, wherein the diode contact is positioned between the first and second regions; and
   implanting dopants of a first conductivity type in the substrate to form first and second top gate regions using second edges of the first and second regions as masks to define first edges of the first and second top gate regions, wherein the distance between the diode contact and the first top gate region is defined by the lateral length of the first region and the distance between the diode contact and the second top gate region is defined by the lateral length of the second region.

2. The method of claim 1, further comprising:
   implanting high density dopants of the first conductivity type in the substrate to form at least one substrate contact region.

3. The method of claim 1, further comprising:
   implanting dopant of the second conductivity type in the substrate to form drift regions; and
   diffusing the dopant of the second conductivity type that forms the drift regions so that the drift regions overlap under a respective one of the first and second regions to form a single main drift region.

4. The method of claim 1, wherein the first and second regions are formed with gate material.

5. The method of claim 1, wherein the first region is coupled to the second region, further wherein the first and second regions form a central opening defining the diode contact.

6. The method of claim 5, wherein the first and second top gate regions extend around an outer perimeter of the first and second regions.

7. The method of claim 1, wherein the first and second regions are formed with dielectric material.

8. The method of claim 7, wherein the first and second regions are formed by local oxidation.

* * * * *